United States Patent
Li

(10) Patent No.: US 10,847,757 B2
(45) Date of Patent: Nov. 24, 2020

(54) CARBON ENABLED VERTICAL ORGANIC LIGHT EMITTING TRANSISTORS

(71) Applicant: Carbon Nanotube Technologies, LLC, Los Angeles, CA (US)

(72) Inventor: Huaping Li, Los Angeles, CA (US)

(73) Assignee: Carbon Nanotube Technologies, LLC, Los Angeles, CA (US)

( * ) Notice: Subject to any disclaimer, the term of this patent is extended or adjusted under 35 U.S.C. 154(b) by 0 days.

(21) Appl. No.: 15/971,998

(22) Filed: May 4, 2018

(65) Prior Publication Data
US 2018/0323406 A1 Nov. 8, 2018

Related U.S. Application Data

(60) Provisional application No. 62/501,617, filed on May 4, 2017.

(51) Int. Cl.
*H01L 51/52* (2006.01)
*H01L 51/00* (2006.01)
(Continued)

(52) U.S. Cl.
CPC ...... *H01L 51/5296* (2013.01); *H01L 51/0045* (2013.01); *H01L 51/0525* (2013.01);
(Continued)

(58) Field of Classification Search
None
See application file for complete search history.

(56) References Cited

U.S. PATENT DOCUMENTS

| 5,180,690 A | 1/1993 | Czubatyj et al. |
| 6,682,863 B2 | 1/2004 | Rivers et al. |

(Continued)

FOREIGN PATENT DOCUMENTS

| CN | 108885967 A | 11/2018 |
| CN | 110892532 A | 3/2020 |

(Continued)

OTHER PUBLICATIONS

Smits et al., "Response of Fe powder, purified and as-produced HiPco single-walled carbon nanotubes to flash exposure", Materials Science and Engineering, 2003, A358, pp. 384-389.
(Continued)

*Primary Examiner* — Zandra V Smith
*Assistant Examiner* — Lawrence C Tynes, Jr.
(74) *Attorney, Agent, or Firm* — KPPB LLP

(57) ABSTRACT

Devices, structures, materials and methods for carbon enabled vertical light emitting transistors (VLETs) and light emitting displays (LEDs) are provided. In particular, architectures for vertical polymer light emitting transistors (VPLETs) for active matrix organic light emitting displays (AMOLEDs) and AMOLEDs incorporating such VPLETs are described. Carbon electrodes (such as from graphene) alone or in combination with conjugated light emitting polymers (LEPs) and dielectric materials are utilized in forming organic light emitting transistors (OLETs). Combinations of thin films of ionic gels, LEDs, carbon electrodes and relevant substrates and gates are utilized to construct LETs, including heterojunction VOLETs.

11 Claims, 5 Drawing Sheets

(51) Int. Cl.
*H01L 51/05* (2006.01)
*H01L 51/56* (2006.01)
*H01L 51/10* (2006.01)
*H01L 51/50* (2006.01)
*C09K 11/06* (2006.01)

(52) U.S. Cl.
CPC ........ *H01L 51/105* (2013.01); *H01L 51/5012* (2013.01); *H01L 51/5092* (2013.01); *H01L 51/5206* (2013.01); *H01L 51/5221* (2013.01); *H01L 51/56* (2013.01); *C09K 11/06* (2013.01); *H01L 51/057* (2013.01)

(56) References Cited

U.S. PATENT DOCUMENTS

| | | | |
|---|---|---|---|
| 6,919,681 | B2 | 7/2005 | Cok et al. |
| 7,064,372 | B2 | 6/2006 | Duan et al. |
| 7,253,041 | B2 | 8/2007 | Gan et al. |
| 7,537,975 | B2 | 5/2009 | Moon et al. |
| 7,907,226 | B2 | 3/2011 | Yang et al. |
| 7,932,511 | B2 | 4/2011 | Duan et al. |
| 8,232,561 | B2 * | 7/2012 | Rinzler ............... B82Y 10/00 257/13 |
| 8,246,928 | B1 | 8/2012 | Rao et al. |
| 8,512,668 | B2 | 8/2013 | Tanaka et al. |
| 8,715,607 | B2 | 5/2014 | Liu et al. |
| 8,940,562 | B1 | 1/2015 | Li |
| 9,070,775 | B2 | 6/2015 | Chaji et al. |
| 9,445,421 | B2 | 9/2016 | Levine et al. |
| 9,455,421 | B2 | 9/2016 | Li |
| 9,487,002 | B2 | 11/2016 | Rogers et al. |
| 9,748,439 | B2 | 8/2017 | Li et al. |
| 10,418,595 | B2 | 9/2019 | Li |
| 10,497,888 | B2 | 12/2019 | Kleemann et al. |
| 10,541,374 | B2 | 1/2020 | Li |
| 10,665,796 | B2 | 5/2020 | Li |
| 2004/0252113 | A1 | 12/2004 | Vicentini et al. |
| 2005/0221016 | A1 | 10/2005 | Glatkowski et al. |
| 2006/0063460 | A1 | 3/2006 | Seo |
| 2006/0081844 | A1 | 4/2006 | Hirosue et al. |
| 2006/0110862 | A1 | 5/2006 | Gan et al. |
| 2006/0145144 | A1 | 7/2006 | Lee et al. |
| 2006/0261433 | A1 | 11/2006 | Manohara et al. |
| 2007/0026646 | A1 | 2/2007 | Chae |
| 2007/0246784 | A1 | 10/2007 | Kang et al. |
| 2008/0008643 | A1 | 1/2008 | Landi et al. |
| 2008/0023066 | A1 | 1/2008 | Hecht et al. |
| 2008/0143906 | A1 | 6/2008 | Allemand et al. |
| 2008/0217588 | A1 | 9/2008 | Arnold et al. |
| 2008/0286447 | A1 | 11/2008 | Alden et al. |
| 2009/0008634 | A1 | 1/2009 | Tessler et al. |
| 2009/0050879 | A1 | 2/2009 | Yamaga et al. |
| 2010/0103089 | A1 | 4/2010 | Yoshida et al. |
| 2010/0145062 | A1 | 6/2010 | Li et al. |
| 2011/0012125 | A1 | 1/2011 | Nicholas et al. |
| 2011/0036403 | A1 | 2/2011 | Yoon et al. |
| 2011/0223095 | A1 | 9/2011 | Harvey et al. |
| 2011/0285951 | A1 | 11/2011 | Yoon et al. |
| 2012/0062109 | A1 | 3/2012 | Berry et al. |
| 2012/0104328 | A1 | 5/2012 | Park et al. |
| 2012/0256175 | A1 * | 10/2012 | Rinzler ............... B82Y 10/00 257/40 |
| 2012/0280213 | A1 | 11/2012 | Gau et al. |
| 2013/0069043 | A1 | 3/2013 | Friend et al. |
| 2013/0105770 | A1 | 5/2013 | Pschenitzka |
| 2013/0108793 | A1 | 5/2013 | Sivarajan et al. |
| 2014/0209997 | A1 | 7/2014 | Qian et al. |
| 2014/0217409 | A1 | 8/2014 | Chaji et al. |
| 2014/0273379 | A1 | 9/2014 | Tsai et al. |
| 2015/0102288 | A1 | 4/2015 | Hersam et al. |
| 2015/0155430 | A1 | 6/2015 | Li |
| 2015/0202662 | A1 | 7/2015 | Li |
| 2015/0279919 | A1 | 10/2015 | Zhou et al. |
| 2015/0340631 | A1 * | 11/2015 | Rinzler ............... H01L 27/092 257/40 |
| 2016/0043152 | A1 | 2/2016 | Tian et al. |
| 2016/0126293 | A1 | 5/2016 | Li et al. |
| 2016/0137854 | A1 | 5/2016 | Heintz et al. |
| 2016/0190170 | A1 | 6/2016 | Yamazaki et al. |
| 2016/0280547 | A1 | 9/2016 | Liu et al. |
| 2016/0359144 | A1 | 12/2016 | Li |
| 2016/0380217 | A1 | 12/2016 | Afzali-Ardakani et al. |
| 2017/0194581 | A1 | 7/2017 | Li |
| 2017/0213963 | A1 | 7/2017 | Cain et al. |
| 2018/0148337 | A1 | 5/2018 | Walsh et al. |
| 2018/0323387 | A1 | 11/2018 | Li |
| 2018/0323388 | A1 | 11/2018 | Li |
| 2018/0358568 | A1 | 12/2018 | Luan et al. |
| 2019/0081259 | A1 | 3/2019 | Mao |
| 2020/0067025 | A1 | 2/2020 | Li |

FOREIGN PATENT DOCUMENTS

| | | |
|---|---|---|
| CN | 111149232 A | 5/2020 |
| GB | 2562921 A | 11/2018 |
| HK | 40000981 A | 2/2020 |
| KR | 10-2020-0005583 A | 1/2020 |
| KR | 10-2020-0024771 A | 3/2020 |
| TW | 201734155 A | 10/2017 |
| WO | 2014208896 A1 | 12/2014 |
| WO | 2015077629 A1 | 5/2015 |
| WO | 2017096058 A1 | 6/2017 |
| WO | 2017120214 A1 | 7/2017 |
| WO | 2018204870 A1 | 11/2018 |
| WO | 2018208284 A1 | 11/2018 |

OTHER PUBLICATIONS

Noh et al., "Ultra-thin polymer gate dielectrics for top-gate polymer field-effect transistors", Organic Electronics, 2009, Published Online Nov. 12, 2008, vol. 10, No. 1, pp. 174-180, doi: 10.1016/j.orgel.2008.10.021.

Nomura et al., "Room-temperature fabrication of transparent flexible thin-film transistors using amorphous oxide semiconductors", Nature, Nov. 25, 2004, vol. 432, pp. 488-492.

O'Connell et al., "Band gap fluorescence from individual single-walled carbon nanotubes", Science, Jul. 26, 2002, vol. 297, pp. 593-596.

Oh et al., "Vertical Type Organic Transistor Using C60 and its Application for OLET", Molecular Crystals and Liquid Crystals, Dec. 21, 2006, vol. 458, No. 1, pp. 247-254, doi: 10.1080/15421400600932439.

Panzer et al., "Low-voltage operation of a pentacene field-effect transistor with a polymer electrolyte gate dielectric", Applied Physics Letters, Feb. 28, 2005, vol. 86, pp. 103503-1-103503-3.

Park et al., "Enhanced luminescence in top-gate-type organic light-emitting transistors", Applied Physics Letters, Aug. 16, 2004, vol. 85, No. 7, pp. 1280-1282.

Park et al., "Flexible full color organic light emitting diode display on polyimide plastic substrate driven by amorphous indium gallium zinc oxide thin-film transistors", Applied Physics Letters, Jul. 6, 2009, vol. 95, No. 1, pp. 013503-1-013503-3, doi: 10.1063/1.3159832.

Park et al., "High-resolution electrohydrodynamic jet printing", Nature Materials, Oct. 2007, vol. 6, pp. 782-789, doi: 10.1038/nmat1974, published online Aug. 5, 2007.

Pei et al., "Polymer Light-Emitting Electrochemical Cells", Science, Aug. 25, 1995, vol. 269, No. 5227, pp. 1086-1088.

Perebeinos et al., "Schottky-to-Ohmic Crossover in Carbon Nanotube Transistor Contacts", Physical Review Letters, week ending Dec. 4, 2013, vol. 111, pp. 236802-1-236802-5, plus supplemental material.

Pivkina et al., "Nanomaterials for Heterogeneous Combustion", Propellants, Explosives, Pyrotechnics, Feb. 26, 2004, vol. 29, No. 1, pp. 39-48; DOI: 10.1002/prep.200400025.

Powell, "The Physics of Amorphous-Silicon Thin-Film Transistors", IEEE Transactions on Electron Devices, Dec. 1989, vol. 36, No. 12, pp. 2753-2763.

Rossi, "Two Decades of Research on Nano-Energetic Materials", Propellants Explos. Pyrotech., Jun. 11, 2014, vol. 39, pp. 323-327. DOI: 10.1002/prep.201480151.

(56) References Cited

OTHER PUBLICATIONS

Rouhi et al., "Fundamental limits on the mobility of nanotube-based semiconducting inks", Advanced Materials, 2011, Published Online Oct. 26, 2010, vol. 23, pp. 94-99, doi: 10.1002/adma.201003281.
Rouhi et al., "High performance semiconducting nanotube inks: progress and prospects", ACS Nano, Oct. 4, 2011, vol. 5, No. 11, 8471-8487, doi: 10.1021/nn201828y.
Rutherglen et al., "Nanotube electronics for radiofrequency applications", Nature Nanotechnology, Dec. 2009, vol. 4, pp. 811-819, published online Nov. 29, 2009.
Sabourin et al., "Functionalized Graphene Sheet Colloids for Enhanced Fuel/Propellant Combustion", ACS Nano, Nov. 19, 2009, vol. 3, No. 12, pp. 3945-3954, doi: 10.1021/nn901006w.
Schoppler et al., "Molar extinction coefficient of single-wall carbon nanotubes", Journal of Physical Chemistry C, Jun. 22, 2011, vol. 115, pp. 14682-14686, doi: 10.1021/jp205289h.
Seo et al., "Improved High-Efficiency Organic Solar Cells via Incorporation of a Conjugated Polyelectrolyte Interlayer", Journal of the American Chemical Society, May 10, 2011, vol. 133, pp. 8416-8419, doi: /10.1021/ja2037673.
Seo et al., "Improved Injection in n-Type Organic Transistors with Conjugated Polyelectrolytes", Journal of the American Chemical Society, Oct. 4, 2009, vol. 131, pp. 18220-18221.
Seo et al., "Solution-Processed Organic Light-Emitting Transistors Incorporating Conjugated Polyelectrolytes", Advanced Functional Materials, Jul. 18, 2011, vol. 21, pp. 3667-3672, doi: 10.1002/adfm.201100682.
Shao et al., "Long-lifetime polymer light-emitting electrochemical cells", Advanced Materials, 2007, vol. 19, pp. 365-370.
Shulaker et al., "Carbon nanotube computer", Nature, Sep. 26, 2013, vol. 501, pp. 526-530, doi: 10.1038/nature12502.
Sirringhaus et al., "Integrated Optoelectronic Devices Based on Conjugated Polymers", Science, Jun. 12, 1998, vol. 280, No. 5370, pp. 1741-1744, doi: 10.1126/science.280.5370.1741.
Slinker et al., "Direct measurement of the electric-field distribution in a light-emitting electrochemical cell", Nature Materials, Nov. 2007, Published Online Sep. 30, 2007, vol. 6, No. 11, pp. 894-899, doi: 10.1038/nmat2021.
Swensen et al., "Light emission from an ambipolar semiconducting polymer field-effect transistor", Applied Physics Letters, Dec. 15, 2005, vol. 87, pp. 253511-1-253511-3.
Sze et al., "Physics of Semiconductor Devices", Third Edition, Wiley, Toronto, 1985, 763 pgs. (presented in five parts).
Takahashi et al., "Carbon nanotube active-matrix backplanes for conformal electronics and sensors", Nano Letters, Nov. 3, 2011, vol. 11, pp. 5408-5413, doi: 10.1021/nl203117h.
Tang et al., "Organic electroluminescent diodes", Applied Physics Letters, Sep. 21, 1987, vol. 51, No. 12, pp. 913-915, doi: 10.1063/1.98799.
Tans et al., "Room-temperature transistor based on a single carbon nanotube", Nature, May 7, 1998, vol. 393, pp. 49-52.
Wang et al., "Wafer-scale fabrication of separated carbon nanotube thin-film transistors for display applications", Nano Letters, Nov. 10, 2009, vol. 9, No. 12, pp. 4285-4291, doi: 10.1021/nl902522f.
Wu et al., "Top-down patterning and self-assembly for regular arrays of semiconducting single-walled carbon nanotubes", Advanced Materials, Jul. 22, 2014, vol. 26, pp. 6151-6156, doi: 10.1002/adma.201401108.
Xia et al., "Printed Sub-2 V Gel-Electrolyte-Gated Polymer Transistors and Circuits", Advanced Functional Materials, Jan. 11, 2010, vol. 20, pp. 587-594, doi: 10.1002/adfm.200901845.
Xu et al., "Vertical organic light emitting transistor", Applied Physics Letters, Aug. 30, 2007, vol. 91, 092991-1-092991-3, doi: 10.1063/1.2778751.
Yamauchi et al., "Fabrication of Vertical Organic Light-Emitting Transistor Using ZnO Thin Film", Japanese Journal of Applied Physics, Apr. 24, 2007, vol. 46, No. 4B, pp. 2678-2682, doi: 10.1143/JJAP.46.2678.

Yan et al., "A high-mobility electron-transporting polymer for printed transistors", Nature, Jan. 21, 2009, vol. 457, doi: 10.1038/nature07727, 10 pgs.
Yang et al., "Control of Cationic Conjugated Polymer Performance in Light Emitting Diodes by Choice of Counterion", Journal of the American Chemical Society, May 27, 2006, vol. 128, pp. 14422-14423, doi: 10.1021/ja063723c.
Young, "When Can I Get My AMOLED TV", Information Display, 2010, vol. 10, pp. 24-29.
Zaumseil et al., "Spatial control of the recombination zone in an ambipolar light-emitting organic transistor", Nature materials, Jan. 2006, vol. 5, pp. 69-74, Published Online Dec. 18, 2005.
Zhang et al., "Self-Enhanced Catalytic Activities of Functionalized Graphene Sheets in the Combustion of Nitromethane: Molecular Dynamic Simulations by Molecular Reactive Force Field", ACS Applied Materials & Interfaces, Jul. 23, 2014, vol. 6, pp. 12235-12244. doi: 10.1021/am501562m.
Zou et al., "Carbon nanotube driver circuit for 6×6 organic light emitting diode display", Scientific Reports, Jun. 29, 2015, vol. 5, No. 11755, pp. 1-9.
De Volder et al., "Carbon nanotubes: present and future commercial applications", Science, Feb. 1, 2013, vol. 339, pp. 535-539.
Dlott, "Thinking big (and small) about energetic materials", Materials Science and Technology, Apr. 2006, vol. 22, No. 4, pp. 463-473, doi:10.1179/174328406X83987.
Drandova et al., "SiN capacitors and ESD", CS Mantech Conference, Apr. 24-27, 2006, pp. 83-86.
Dreizin, "Metal-based reactive nanomaterials", Progress in Energy and Combustion Science, Apr. 2009, vol. 35, pp. 141-167, doi:10.1016/j.pecs.2008.09.001.
Dresselhaus et al., "Raman spectroscopy on isolated single wall carbon nanotubes", Carbon, 2002, vol. 40, pp. 2043-2061.
Friend et al., "Electroluminescence in conjugated polymers", Nature, Jan. 14, 1999, vol. 397, pp. 121-128.
Gao et al., "Complementary Logic Gate Arrays Based on Carbon Nanotube Network Transistors", Small, 2013, vol. 9, No. 6, pp. 813-819.
Ghosh et al., "Advanced sorting of single-walled carbon nanotubes by nonlinear density-gradient ultracentrifugation", Nature Nanotechnology, May 9, 2010, vol. 5, pp. 443-450.
Gu et al., "Design of flat panel displays based on organic light emitting devices", IEEE Journal of Selected Optics in Quantum Electronics, Jan./Feb. 1998, vol. 4, pp. 83-99.
Gundlach et al., "Pentacene Organic Thin-Film Transistors—Molecular Ordering and Mobility", IEEE Electron Device Letters, Mar. 1997, vol. 18, No. 3, pp. 87-89.
Ha et al., "Highly Uniform and Stable n-Type Carbon Nanotube Transistors by Using Positively Charged Silicon Nitride Thin Films", Nano Letters, 2015, vol. 15, pp. 392-397, published Dec. 1, 2014.
Hennrich et al., "Length-Sorted, Large-Diameter, Polyfluorene-Wrapped Semiconducting Single-Walled Carbon Nanotubes for High-Density, Short-Channel Transistors", ACS Nano, Jan. 2016, vol. 10, No. 2, pp. 1888-1895, doi: 10.1021/acsnano.5b05572.
Ho et al., "Molecular-scale interface engineering for polymer light-emitting diodes", Nature, Mar. 30, 2000, vol. 404, No. 6777, pp. 481-484.
Hone et al., "Thermal properties of carbon nanotubes and nanotube-based materials", Applied Physics A, Mar. 4, 2002, vol. 74, pp. 339-343.
Hoven et al., "Electron injection into organic semiconductor devices from high work function cathodes", Proceedings of the National Academy of Sciences of the United States of America, Sep. 2, 2008, vol. 105, No. 35, pp. 12730-12735.
Hoven et al., "Ion motion in conjugated polyelectrolyte electron transporting layers", Journal of the American Chemical Society, 2007, vol. 129, No. 36, pp. 10976-10977, doi: 10.1021/ja072612q.
Hsu et al., "Control of Efficiency, Brightness, and Recombination Zone in Light-Emitting Field Effect Transistors", Advanced Materials, Jan. 25, 2012, vol. 24, pp. 1171-1175, doi: 10.1002/adma.201103513.
Iechi et al., "Vertical type organic light emitting device using thin-film ZnO electrode", Synthetic Metals, 2005, vol. 154, pp. 149-152.

(56) References Cited

OTHER PUBLICATIONS

Isert et al., "The effect of encapsulated nanosized catalysts on the combustion of composite solid propellants", Combustion and Flame, 2015, Published Online Dec. 23, 2014, vol. 162, pp. 1821-1828.
Javey et al., "Ballistic carbon nanotube field-effect transistors", Nature, Aug. 7, 2003, vol. 424, pp. 654-657.
Javey et al., "High-K dielectrics for advanced carbon-nanotube transistors and logic gates", Nature Materials, Dec. 2002, vol. 1, pp. 241-245, published online Nov. 17, 2002.
Javey et al., "Self-aligned ballistic molecular transistors and electrically parallel nanotube arrays", Nano Letters, May 24, 2004, vol. 4, No. 7, pp. 1319-1322.
Keplinger et al., "Stretchable, Transparent, Ionic Conductors", Science, Aug. 30, 2013, vol. 341, No. 6149, pp. 984-987, doi: 10.1126/science.1240228.
Kim et al., "Electrical contacts to carbon nanotubes down to 1 nm in diameter", Applied Physics Letters, Oct. 17, 2005, vol. 87, pp. 173101-1-173101-3.
Kim et al., "Polymer gate dielectric surface viscoelasticity modulates pentacene transistor performance", Science, Oct. 5, 2007, vol. 318, pp. 76-80.
Kimura et al., "Low- temperature polysilicon thin-film transistor driving with integrated driver for high resolution light emitting polymer display", IEEE Transactions on Electron Devices, Dec. 1999, vol. 46, Issue 12, pp. 2282-2288.
Kudo, "Organic light emitting transistors", Current Applied Physics, 2005, First Published Jun. 7, 2004, vol. 5, pp. 337-340, doi: 10.1016/j.cap.2003.11.095.
Li et al., "Electronically Pure Single-Chirality Semiconducting Single-Walled Carbon Nanotube for Large-Scale Electronic Devices", ACS Applied Materials & Interfaces. Aug. 3, 2016, vol. 8, No. 32, pp. 20527-20533.
Li et al., "Molecular Design, Device Function and Surface Potential of Zwitterionic Electron Injection Layers", Journal of the American Chemical Society, Mar. 17, 2009, vol. 131, No. 25, pp. 8903-8912, doi: 10.1021/ja9018836.
Li et al., "Polyfluorinated electrolyte for fully printed carbon nanotube electronics", Advanced Functional Materials, Aug. 3, 2016, vol. 26, No. 38, pp. 6914-6920, doi: 10.1002/adfm. 201601605.
Li et al., "Silicon nitride gate dielectric for top-gated carbon nanotube field effect transistors", Journal of Vacuum Science & Technology B 22, Dec. 10, 2004, pp. 3112-3114.
Li et al., "The Effect of Interface States on Single-Walled Carbon Nanotube Transistors", ECS Journal of Solid State Science and Technology, Aug. 5, 2016, vol. 5, pp. M93-M98, doi: 10.1149/2. 0271609jss.
Liang et al., "Elastomeric polymer light-emitting devices and displays", Nature Photonics, Oct. 2013, Published Online Sep. 22, 2013, vol. 7, pp. 817-824. doi: 10.1038/NPHOTON.2013.242.
Lin et al., "A novel LTPS-TFT pixel circuit compensating for TFT threshold-voltage shift and OLED degradation for AMOLED", IEEE Electron Device Letters, Feb. 2007, vol. 28, No. 2, pp. 129-131.
Lin et al., "Ambipolar-to-Unipolar Conversion of Carbon Nanotube Transistors by Gate Structure Engineering", Nano Letters, Mar. 12, 2004, vol. 4, No. 5, pp. 947-950.
Lin et al., "The Impact of Scaling-Down Oxide Thickness on Poly-Si Thin-Film Transistors' I-V Characteristics", IEEE electron device letters, Apr. 1994, vol. 15, No. 4, pp. 138-139.
Liu et al., "Large-scale single-chirality separation of single-walled carbon nanotubes by simple gel chromatography", Nature Communications, May 10, 2011, vol. 2, No. 309, pp. 1-8.
Logdlund et al., "Theoretical-studies of the interaction between aluminum and poly(pphenylenevinylene) and derivatives", The Journal of Chemical Physics, Sep. 1, 1994, vol. 101, pp. 4357-4364, doi: 10.1063/1.467486.
Maehashi et al., "Electrical characterization of carbon nanotube field-effect transistors with SiN x passivation films deposited by catalytic chemical vapor deposition", Applied Physics Letters, May 9, 2008, vol. 92, pp. 183111-1-183111-3; doi:10.1063/1.2920206.
Matyba et al., "The dynamic organic p-n junction", Nature Materials, Aug. 2009, Published Online Jun. 21, 2009, vol. 8, No. 8, pp. 672-676, doi: 10.1038/NMAT2478.
McCarthy et al., "Low-Voltage, Low-Power, Organic Light-Emitting Transistors for Active Matrix Displays", Science, Apr. 29, 2011, vol. 332, Issue 6029, pp. 570-573, doi: 10.1126/science. 1203052.
Meda et al., "Nano-aluminum as energetic material for rocket propellants", Materials Science and Engineering C, 2007, vol. 27, Issues 5-8, pp. 1393-1396, doi: doi:10.1016/j.msec.2006.09.030.
Meda et al., "Nano-composites for rocket solid propellants", Composites Science and Technology, 2005, vol. 65, Issue 5, pp. 769-773.
Muccini, "A bright future for organic field-effect transistors", Nature Materials, Aug. 2006, vol. 5, No. 8, pp. 605-613.
Nakamura et al., "Improvement of Metal-Insulator-Semiconductor-Type Organic Light-Emitting Transistors", Japanese Journal of Applied Physics, Mar. 21, 2008, vol. 47, No. 3, pp. 1889-1893, doi: 10.1143/JJAP.47.1889.
Definition of "form," Merriam Webster Online, Retrieved from the Internet on Feb. 20, 2016.
International Preliminary Report on Patentability for International Application PCT/US2014/066926, dated May 24, 2016, dated Jun. 6, 2016, 12 pgs.
International Preliminary Report on Patentability for International Application PCT/US2017/012161, dated Jul. 10, 2018, dated Jul. 19, 2018, 11 pgs.
International Search Report and Written Opinion for International Application PCT/US2016/064449, completed Mar. 17, 2017, dated Apr. 4, 2017, 12 pgs.
International Search Report and Written Opinion for International Application PCT/US2017/012161, completed Feb. 24, 2017, dated May 5, 2017, 14 pgs.
International Search Report and Written Opinion for International Application PCT/US2017/031619, completed Jul. 11, 2017, dated Aug. 14, 2017, 15 pgs.
International Search Report and Written Opinion for International Application PCT/US2018/031230, completed Jul. 16, 2018, dated Aug. 1, 2018, 13 pgs.
International Search Report and Written Opinion for International Application PCT/US2014/066926, Completed Feb. 2, 2015, dated Mar. 3, 2015, 14 pgs.
"Global Flat Panel Displays Market to Reach US$110 Billion by 2017", Global Industry Analysts, Inc., Mar. 15, 2012, 3 pgs.
"Large AMOLED gets a cost edge over LCD", Sector Report Display, Korea Investment & Securities Co., Ltd. Aug. 16, 2011, 32 pgs.
"LCD TV Growth Improving, As Plasma and CRT TV Disappear", NPD DisplaySearch, Apr. 16, 2014, 2 pgs.
"Oxide TFT Production Forecast to Overtake LTPS in 2016", NPD DisplaySearch, Sep. 10, 2013, 4 pgs.
"Spin coating", Wkipedia, Oct. 23, 2015; Retrieved on Jul. 11, 2017, 2 pgs.
Almudever et al., "Variability and reliability of CNFET technology: impact of manufacturing imperfections", Microelectronics Reliability, Feb. 1, 2015, vol. 55, No. 2, pp. 358-366.
Aradhya et al., "Electrothermal Bonding of Carbon Nanotubes to Glass", Journal of the Electrochemical Society, Jul. 22, 2008, vol. 155, No. 9, pp. K161-K165.
Armstrong et al., "Enhanced Propellant Combustion with Nanoparticles", Nano Letters, Jan. 9, 2003, vol. 3, No. 2, pp. 253-255, doi: 10.1021/nl025905k.
Arnold et al., "Sorting carbon nanotubes by electric structure using density differentiation", Nature Nanotechnology, Oct. 2006, vol. 3, pp. 60-65.
Bachilo et al., "Structure-assigned optical spectra of single-walled carbon nanotubes", Science, Dec. 20, 2002, vol. 298, pp. 2361-2366, doi: 10.1126/science.1078727.
Ben-Sasson et al., "Patterned electrode vertical field effect transistor fabricated using block copolymer nanotemplates", Applied Physics Letters, Nov. 2009, vol. 95, pp. 213301-1-213301-3.

(56) References Cited

OTHER PUBLICATIONS

Bhat et al., "Electroluminescence in ion-gel gated conjugated polymer field-effect transistors", Chemistry of Materials, Oct. 7, 2012, vol. 24, pp. 4060-4067, doi: 10.1021/cm301610w.

Bonhommeau et al., "Raman spectroscopic investigation of individual single-walled carbon nanotubes helically wrapped by ionic, semiconducting polymers", Journal of Physical Chemistry C, Jun. 20, 2013, vol. 117, pp. 14840-14849, doi: 10.1021/jp4037606.

Braga et al., "High-Transconductance Organic Thin-Film Electrochemical Transistors for Driving Low-Voltage Red-Green-Blue Active Matrix Organic Light-Emitting Devices", Advanced Functional Materials, Feb. 14, 2012, vol. 22, pp. 1623-1631, doi: 10.1002/adfm.201102075.

Briseno et al., "Patterning Organic Single-Crystal Transistor Arrays", Nature, Dec. 14, 2006, vol. 444, pp. 913-917.

Bronikowski et al., "Gas-phase production of carbon single-walled nanotubes from carbon monoxide via the HiPco process: a parametric study", J Vac. Sci. Technol. A., May 2, 2001, vol. 19, pp. 1800-1805.

Brousseau et al., "Nanometric Aluminum in Explosives", Propellants, Explosives, Pyrotechnics, Feb. 27, 2002, vol. 27, pp. 300-306.

Cao et al., "Improved quantum efficiency for electroluminescence in semiconducting polymers", Nature, Feb. 4, 1999, vol. 397, pp. 414-417.

Cao et al., "Medium-scale carbon nanotube thin-film integrated circuits on flexible plastic substrate", Nature, Jul. 24, 2008, vol. 454, pp. 495-500.

Capelli et al., "Organic light-emitting transistors with an efficiency that outperforms the equivalent light-emitting diodes", Nature Materials, Jun. 2010, vol. 9, pp. 496-503, published online May 2, 2010.

Chaban et al., "Buckybomb: Reactive Molecular Dynamics Simulation", Journal of Physics Chemistry Letters, Feb. 24, 2015, vol. 6, pp. 913-917, DOI: 10.1021/ acs.jpclett.5b00120.

Chang et al., "Improved Electrical Performance of MILC Poly-Si TFTs Using CF4 Plasma by Etching Surface of Channel", IEEE Electron Device Letters, Feb. 2009, vol. 30, No. 2, pp. 130-132.

Cherenack et al., "Amorphous-silicon thin-film transistors fabricated at 300° C. on a free-standing foil substrate of clear plastic", IEEE Electron Device Letters, Nov. 2007, vol. 28, No. 11, pp. 1004-1006.

Chiang et al., "Purification and Characterization of Single-Wall Carbon Nanotubes (SWNTs) Obtained from the Gas-Phase Decomposition of Co (HiPco Process)", J. Phys. Chem. B, Aug. 10, 2001, vol. 105, pp. 8297-8301, doi:10.1021/jp0114891.

Cho et al., "Printable ion-gel gate dielectrics for low-voltage polymer thin-film transistors on plastic", Nature Materials, Nov. 2008, Published Online Oct. 19, 2008, vol. 7, pp. 900-906, doi: 10.1038/nmat2291.

Chortos et al., "Investigating Limiting Factors in Stretchable All-Carbon Transistors for Reliable Stretchable Electronics", ACS Nano, Jul. 26, 2017, vol. 11, pp. 7925-7937, doi: 10.1021/acsnano.7b02458.

Chortos et al., "Mechanically Durable and Highly Stretchable Transistors Employing Carbon Nanotube Semiconductor and Electrodes", Advanced Materials, 2016, Published Online Jul. 14, 2015, vol. 28, pp. 4441-4448, doi: 10.1002/adma.201501828.

Dai et al., "Solution-processed, high-performance light-emitting diodes based on quantum dots", Nature, Nov. 6, 2014, vol. 515, pp. 96-99.

International Preliminary Report on Patentability for International Application PCT/US2017/031619, Report dated Nov. 12, 2019, dated Nov. 21, 2019, 8 pgs.

International Preliminary Report on Patentability for International Application PCT/US2018/031230, Report dated Nov. 5, 2019, dated Nov. 14, 2019, 8 pgs.

\* cited by examiner

CARBON ENABLED VERTICAL ORGANIC LIGHT EMITTING TRANSISTORS

CROSS-REFERENCE TO RELATED APPLICATIONS

This application claims priority to U.S. Provisional Patent Application No. 62/501,617, filed May 4, 2017, the disclosure of which is incorporated herein by reference.

FIELD OF THE INVENTION

Devices, structures, materials and methods for carbon enabled vertical organic light emitting transistors and light emitting displays are presented.

BACKGROUND OF THE INVENTION

Organic Light Emitting Diode (OLED) displays have been highly anticipated by electronic consumers due to their well-recognized advantages in power consumption, pixel brightness, viewing angle, response time, and contrast ratio over liquid crystal displays (LCD). (See, e.g., G. Gu and S. R. Forrest, *IEEE Journal of Selected Topics in Quantum Electronics*, vol. 4, pp. 83-99, 1998, the disclosure of which is incorporated herein by reference.) However, the advances promised by OLEDs have not been realized at least partially as the result of limitations in the materials used in their formation. For example, the current active matrix TFT backplanes used to drive AM-LCD pixels are typically made of amorphous silicon (a-Si), which has a low mobility (~1 $cm^2V^{-1}s^{-1}$) and poor stability, and is therefore unsuitable for OLED pixels. (See, M. J. Powell, *IEEE Transactions on Electron Devices*, vol. 36, pp. 2753-2763, 1989, the disclosure of which is incorporated herein by reference.) As a result of these deficiencies, currently AMOELD displays are driven by low temperature polycrystalline silicon (poly-Si) TFTs that suffer from high fabrication cost and time, and device size, orientation, and inhomogeneity limitations, all of which present a severe challenge to increasing display size and production yield. (See, e.g., C.-P. Chang and Y.-C. S. Wu, *IEEE electron device letters*, vol. 30, pp. 130-132, 2009; Y.-J. Park, M.-H. Jung, S.-H. Park and O. Kim, *Japanese Journal of Applied Physics*, vol. 49, pp. 03CD01, 2010; and P.-S. Lin, and T.-S. Li, *IEEE electron device letters*, vol. 15, pp. 138-139, 1994, each of the disclosures of which are incorporated herein by reference.)

Solution processible organic semiconductor materials are attractive alternatives to poly-Si because of their homogeneity, low cost, and varied deposition methods. (See, e.g., D. J. Gundlach, et al., *IEEE Electron Device Letters*, vol. 18, pp. 87-89, 1997; H. Yan, et al., *Nature*, vol. 457, pp. 679-686, 2009; and A. L. Briseno, et al., Nature, vol. 444, pp. 913-917, 2006, the disclosures of each of which are incorporated herein by reference.) However, in a conventional TFT architecture, the low-mobility of organic films requires a large source-drain voltage (>20 V) to turn on the OLED devices. (See, H. Sirringhaus, et al., *Science*, vol. 280, pp. 1741-1744, 1998, the disclosure of which is incorporated herein by reference.) Stable high-transconductance organic thin-film electrochemical transistors using a high capacitance electrolyte as the gate dielectric layer have been demonstrated. (See, e.g., J. H. Cho et al., *Nature Materials*, vol. 7, pp. 900-906, 2008; and Y. Xia, et al., *Advanced Functional Materials*, vol. 20, pp. 587-594, 2010, the disclosures of each of which are incorporated herein by reference.) Using these devices it is possible to control a high efficiency red, green and blue AMOLED with supply voltages near 4 V and sub-1 V driving voltages. (See, e.g., D. Braga, et al., Advanced Functional Materials, vol. 22, pp. 1623-1631, 2012, the disclosure of which is incorporated herein by reference.) Though these approaches are promising, the required fabrication steps still limit the simplicity of system architecture and consequently production costs.

SUMMARY OF THE INVENTION

Devices, structures, materials and methods for graphene enabled vertical organic light emitting transistors (OLETs) and organic light emitting displays (OLEDs) are provided.

Some embodiments are direct to vertical light emitting transistors, including:
- a light emitting cell including a light emitting layer formed of at least one light emitting material, the light emitting layer having first and second sides in conductive relation to a conductive drain electrode and a conductive source electrode;
- at least one capacitor including a dielectric layer formed of at least one dielectric material, the at least one dielectric layer having first and second sides in conductive relation to one of either the conductive source or drain electrodes, and a conductive gate electrode; and
- at least one substrate in supportive relation with each of said drain/source and gate electrodes;
- wherein the drain and source electrodes are the cathode and anode of the light emitting cell; and
- wherein at least the electrode disposed between the light emitting layer and the dielectric layer is a gate tunable carbon electrode.

In some other embodiments the carbon enabled vertical light emitting transistor, includes:
- a light emitting cell comprised of a light emitting layer formed of at least one light emitting material, the light emitting layer having first and second sides in conductive relation to a conductive drain electrode and a source electrode;
- at least one capacitor comprised of a dielectric layer formed of at least one dielectric material, the at least one dielectric layer having first and second sides in conductive relation to one of either the conductive source or drain electrodes, and a conductive gate electrode; and
- at least one substrate in supportive relation with each of said drain and gate electrodes;
- wherein the drain and source electrodes are the cathode and anode of the light emitting cell; and
- wherein at least the electrode disposed between the light emitting layer and the dielectric layer is a gate tunable carbon electrode.

In still some other embodiments all of the electrodes are formed of a transparent carbon material.

In yet some other embodiments the carbon electrode is formed of one or more layers selected from the group of graphene, graphene oxide, fluorographene, graphane, functionalized graphene sheets, or combinations thereof.

In still yet some other embodiments the light emitting layer is formed of a light emitting material selected from the group consisting of a crystalline semiconductor selected from GaN, GaP, GaAs, AlGaAs, GaAsP, AlGaInP, ZnSe, InGaN and AlN; a semiconductor nanowire selected from Si and GaAs; a quantum wall; an organometallic complex; an Ir organometallic complex; a small organic conjugated molecule; porphyrin; pentacene; and a conjugated polymer selected from PPV, PVK, MEH-PPV, PPF, PFO and PPP.

In still yet some other embodiments the dielectric material is selected from the group of an oxides selected from $SiO_2$, $Al_2O_3$, $HfO_2$, $ZrO_2$; a nitride; $Si_3N_4$; an inorganic salts selected from LiF, CsF, $BaTiO_3$, and $SrTiO_3$; a dielectric polymer selected from PMMA, Teflon, CYTOP, and Nafion; and an ionic gel formed from the combination of a dielectric polymer and an ionic liquid.

In still yet some other embodiments the transistor further includes at least one additional light emitting enhancement layer selected from the group consisting of electron injection dipole layers, transportation dipole layers, conjugate polyelectrolyte layers, and hole injection layers.

In still yet some other embodiments the substrate is selected from the group consisting of flexible plastics, Si wafer, glass, sapphire, and ITO.

In still yet some other embodiments the transistor further includes a heterojunction transistor comprising: an additional carbon electrode disposed between a dielectric layer and a semiconductor layer disposed adjacent the dielectric layer of the at least one capacitor such that the vertical light emitting transistor has a two transistor and one capacitor control. In some such embodiments the semiconductor layer is formed of a material selected from the group of inorganic semiconductors, oxide semiconductors, flakes of 2D layered materials, and organic thin films.

In still yet some other embodiments the vertical light emitting transistor is one of either top or bottom-gated.

Various other embodiments are directed to methods of forming vertical light emitting transistors, including:
forming a light emitting layer formed of at least one light emitting material, the light emitting layer having first and second sides;
forming at least one of a conductive drain electrode and a conductive source electrode in conductive relation with at least one side of said light emitting layer;
forming a least one capacitor comprised of a dielectric layer formed of at least one dielectric material, the at least one dielectric layer having first and second sides in conductive relation to one of either the conductive source or drain electrodes, and a conductive gate electrode;
encapsulating the formed layers using one of either a glass or barrier film; and
wherein at least the electrode disposed between the light emitting layer and the dielectric layer is a gate tunable carbon electrode.

In various other embodiments the methods further includes one of the following combination of steps:
disposing the light emitting material atop a PEDOT coated ITO substrate, disposing one of either the drain or source electrode atop the light emitting layer, disposing the dielectric layer atop the one of either the drain or source electrode present atop the light emitting layer, and disposing the gate electrode atop the dielectric layer;
disposing a first dielectric layer atop a first gate electrode, disposing one of either the drain or source electrode atop the first dielectric layer, disposing the light emitting layer atop the one of either the drain or source electrode disposed atop the first dielectric layer, disposing one of either the drain or source electrode atop the light emitting layer; disposing a second dielectric layer over the one of either the drain or source electrode disposed atop the light emitting layer, and disposing a second gate electrode atop the second dielectric layer;

disposing the dielectric layer atop the gate electrode, disposing one of either the drain or source electrode atop the dielectric layer, and disposing the light emitting layer atop a PEDOT coated ITO substrate that is further laminated with the one of either the drain or source electrode which is disposed atop the dielectric layer; and
disposing the dielectric layer atop the gate electrode, disposing one of either the drain or source electrode disposed atop the dielectric layer, disposing the light emitting layer atop the one of either the drain or source electrode disposed atop the dielectric layer, and disposing the light emitting layer that is laminated with the one of either the drain or source electrode not disposed atop the dielectric layer.

In still various other embodiments the light emitting layer is formed by a deposition process selected from plasma enhanced chemical vapor deposition, low pressure chemical vapor deposition, molecular beam epitaxy, spin-coating, spray coating, aerosol jet printing, inkjet printing, screen printing, gravure printing, and flexograph printing.

In yet various other embodiments at least one of the source, drain, and gate electrodes comprise a metal selected from Al, Au, Ag, Cu, Ni, Cr, Mo, and their combination formed by plasma enhanced chemical vapor deposition or low pressure chemical vapor deposition.

In still yet various other embodiments the at least one carbon electrode is formed from a material selected from the group of graphene, graphene oxide, fluorographene, graphane, functionalized graphene sheets, or combinations thereof. In some such embodiments the carbon electrode is formed by a process selected from transferring, spin-coating, spray coating, aerosol jet printing, inkjet printing, screen printing, gravure printing, and flexograph printing.

In still yet various other embodiments the dielectric layer comprises a dielectric material selected from $SiO_2$, $Al_2O_3$, $Si_3N_4$ $HfO_2$, $ZrO_2$ and LiF formed by a process selected from one of either plasma enhanced chemical vapor deposition and low pressure chemical vapor deposition.

In still yet various other embodiments the dielectrics layer comprises one of a dielectric polymer, an ionic gel, and a dielectric polymer/nanoparticle composite formed by a process selected from spin-coating, spray coating, aerosol jet printing, inkjet printing, screen printing, gravure printing, and flexograph printing.

In still yet various other embodiments the method further includes forming a heterojunction above or below the transistor comprising an additional carbon electrode disposed between a dielectric layer and a semiconductor layer disposed adjacent the dielectric layer of the at least one capacitor such that the vertical light emitting transistor has a two transistor and one capacitor control.

Many other embodiments of the invention are directed to vertical light emitting displays including a plurality of pixels comprising a plurality of vertical light emitting transistors electronically coupled into addressing electrode lines, each vertical light emitting transistor including:
a light emitting cell comprised of a light emitting layer formed of at least one light emitting material, the light emitting layer having first and second sides in conductive relation to a conductive drain electrode and a source electrode;
at least one capacitor comprised of a dielectric layer formed of at least one dielectric material, the at least one dielectric layer having first and second sides in conductive relation to one of either the conductive source or drain electrodes, and a conductive gate electrode; and at least one substrate in supportive relation with each of said drain and gate electrodes;

wherein the drain and source electrodes are the cathode and anode of the light emitting cell; and wherein at least the electrode disposed between the light emitting layer and the dielectric layer is a gate tunable carbon electrode.

In many other embodiments the vertical light emitting transistors further comprises a heterojunction comprising an additional carbon electrode disposed between a dielectric layer and a semiconductor layer disposed adjacent the dielectric layer of the at least one capacitor such that the vertical light emitting transistor has a two transistor and one capacitor control.

In still many other embodiments the light emitting layer is formed of a light emitting material selected from the group consisting of a crystalline semiconductor selected from GaN, GaP, GaAs, AlGaAs, GaAsP, AlGaInP, ZnSe, InGaN and AlN; a semiconductor nanowire selected from Si and GaAs; a quantum wall; an organometallic complex; an Ir organometallic complex; a small organic conjugated molecule; porphyrin; pentacene; and a conjugated polymer selected from PPV, PVK, MEH-PPV, PPF, PFO and PPP;

the dielectric material is selected from the group of an oxides selected from $SiO_2$, $Al_2O_3$, $HfO_2$, $ZrO_2$; a nitride; $Si_3N_4$; an inorganic salts selected from LiF, CsF, $BaTiO_3$, and $SrTiO_3$; a dielectric polymer selected from PMMA, Teflon, CYTOP, and Nafion; and an ionic gel formed from the combination of a dielectric polymer and an ionic liquid;

the substrate is selected from the group consisting of flexible plastics, Si wafer, glass, sapphire, and ITO; and wherein the at least one carbon electrode is formed from a material selected from the group of graphene, graphene oxide, fluorographene, graphane, functionalized graphene sheets, or combinations thereof.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as exemplary embodiments of the invention and should not be construed as a complete recitation of the scope of the invention, wherein.

DETAILED DESCRIPTION OF THE INVENTION

Figure 1A:
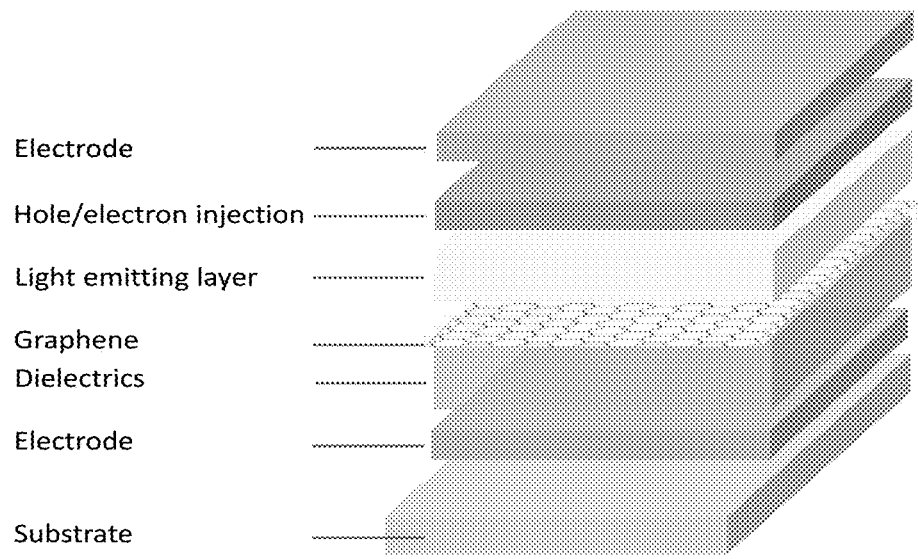
FIG. 1A provides a schematic diagram of a bottom-gated organic light emitting diode with a graphene injection electrode in accordance with embodiments of the invention.

Turning to the drawings, devices, materials and methods for forming carbon enabled organic light emitting transistors (OLETs) and displays formed from such diodes are provided. In particular embodiments, architectures for carbon (e.g., graphene) graphene) enabled vertical organic light emitting transistors (VLETs), and in particular carbon (e.g., graphene) enabled vertical organic light emitting transistors (VOLETs) for active matrix organic light emitting displays (AMOLEDs) and AMOLEDs incorporating such VOLETs are described. Although many VLET architectures are provided, in embodiments novel VLET architectures incorporating single and multiple graphene electrodes are described. In such embodiments, the brightness and device efficiency of the OLETs may be controlled by tailoring the work function of the graphene by the use of electrostatic gating fields. In some embodiments, combinations of suitable graphene layers, LEDs, and relevant substrates and gates are utilized to construct such VOLETs, including carbon injection electrodes, all carbon electrodes, and suitable carbon enabled control circuitry. In many embodiments, the VOLET substrates are transparent and/or flexible, and can be made of suitable materials such as PET. In other embodiments, processes such as, for example, spin-coating and printing processes are utilized to deposit layers of graphene, LEDs, and dielectric materials on various substrates to construct the OLETs. It will be understood that for the purposes of this disclosure graphene and carbon may be used interchangeably and may refer to various forms of gate tunable carbon, as will be described in greater detail below.

As previously discussed, active matrix organic light emitting displays (AMOLEDs) are highly attractive due to their power saving, ultra high definition, and broad viewing angles. In particular, advances in organic light emitting transistors (OLETs) exhibit improved external efficiency over organic light emitting diodes (OLEDs) by directly modulating charge carriers of light emitting materials. Further, inducing a vertical structure in OLETs circumvents the intrinsic low mobility of organic materials by providing short channel length, thereby making it possible to achieve high conductance at low power and low voltages, thus enhancing the energy conversion efficiency, the lifetime and stability of the organic materials. Moreover, combining thin film transistor (TFT) switching and OLED light emitting properties in a single device leads to a simplified fabrication process and reduced cost. However, technical challenges still exist. As will be described below, the use of novel graphene materials and manufacturing combinations, in charge injection layers and electrode structures can provide devices with wholly novel properties.

Embodiments Incorporating Carbon Materials

As previously discussed, OLETs have been demonstrated to exhibit ON/OFF functionality of TFTs and the electroluminescence of OLEDs in a single device. (See, e.g., J. Zaumsei, R. H. Friend and H. Sirringhaus, *Nature materials*, vol. 5, pp. 69-74, 2005; R. Capelli, et al., *Nature Materials*, vol 9, pp. 496-503, 2010; and M. Muccini, *Nature Materials*, vol. 5, pp. 605-613, 2006, the disclosures of which are incorporated herein by reference.) Vertical-type OLETs have been reported on varied designs and operating principles to operate in low-voltages with short channel length. In particular, LEPs have been fabricated into PLETs with noble metals as electrodes. (See, e.g., J. Zaumsei, R. H. Friend and H. Sirringhaus, Nature materials, vol. 5, pp. 69-74, 2005, the disclosure of which is incorporated herein by reference.) Various VPLETs were also reported that demonstrated poor performance. (See, e.g., B. Park and H. Takezoe, Applied Physics Letters, vol. 85, pp. 1280-1282, 2004; H. Lechi, et al., Synthetic Metals, vol. 154, pp. 149-152, 2005; K. Kudo, Current Applied Physics, vol. 5, pp. 337-340, 2005; S. Y. Oh, et al., Molecular Crystals and Liquid Crystals, vol. 458, pp. 247-254, 2006; Z. Xu, et al., Applied Physics Letters, vol. 91, pp. 092911, 2007; and H. Yamauchi, et al., Japanese Journal of Applied Physics, vol. 46, pp. 2678, 2007, the disclosures of each of which are incorporated herein by reference.) In addition, severe material limitations exist as to usable electrode materials. In particular, electrodes of transmittance greater than 98% across the visible spectrum window are required to allow for the emission of light in these devices across their full aperture. (See, e.g., B. Park and H. Takezoe, *Applied Physics Letters*, vol. 85, pp. 1280-1282, 2004; H. Lechi, et al., *Synthetic Metals*, vol. 154, pp. 149-152, 2005; K. Kudo, *Current Applied Physics*, vol. 5, pp. 337-340, 2005; S. Y. Oh, et al., *Molecular Crystals and Liquid Crystals*, vol. 458, pp. 247-254, 2006; Z. Xu, et al., *Applied Physics Letters*, vol. 91, pp. 092911, 2007; H. Yamauchi, et al., *Japanese Journal of Applied Physics*, vol. 46, pp. 2678, 2007; and K. Nakamura, et al., *Japanese Journal of Applied Physics*, vol. 47, pp. 1889, 2008, the disclosures of each of which are incorporated herein by reference.)

Transparent conductive electrodes are characterized by benchmark values for transparency and conductivity. A good material for use in VOLET devices should have a high transparency and a low sheet resistance. Currently the state of the art in transparent conductive electrodes is ITO (Indium titanium oxide), which has an excellent combination of high transparency and low sheet resistance. However, ITO is made of low abundance elements, and thus increases device cost. There are many fast-emerging transparent conductive materials like TCO (Transparent conductive oxide), PEDOTs (poly(3,4-ethylenedioxythiophene)) and other highly doped conductive polymers. (See, e.g., C. Keplinger, et al., *Science*, vol. 341, pp. 984-987, 2013, the disclosure of which is incorporated herein by reference.)

Carbon (e.g., graphene) has been extensively investigated for scientific research and technological applications due to its unique electrical, mechanical and optical properties. Combined with the high conductivity and high transparency in optical window, graphene has been reported for transparent electrodes for organic light-emitting diodes (OLEDs). Additionally, the work function of graphene can be adjusted electrostatically over a wide range by tuning the Fermi energy (EF) via the electrostatic field effect. A Schottky barrier (SB) occurs at the interface between graphene electrode and semiconductor, thus the charge carrier injection/collection from graphene/semiconductor to semiconductor/graphene can be modulated by adjusting SB height via external gating filed. This gate tunable charge injection property of graphene may be employed to build vertical heterojunction transistors with inorganic semiconductors (n- and p-type silicon), oxide semiconductors (n-type indium gallium zinc oxide), flakes of 2D layered materials (hexagonal boron nitride, molybdenum disulfide, and tungsten disulfide), and organic thin films (P3HT and C60). In addition, the enhanced lateral thermal conductivity of graphene can spread the thermal load to a larger area and thus reduce the thermal resistance. Finally, the use of graphene for the graphene material layer also can lower the structure turn-on voltage of the structure thereby reducing power dissipation within the structure.

Devices are now proposed in which carbon (e.g., graphene) is incorporated into OLEDs or VOLETS to implement gate tunable charge injection in these devices, such that brightness and device efficiency can be controlled by tailoring the work function of the graphene via an electrostatic gating field. Embodiments are now directed to such carbon enabled VOLETs and the methods of their manufacture.

Embodiments of VOLETs and OLEDs Comprising Graphene Injection Electrodes

Figure 1B:
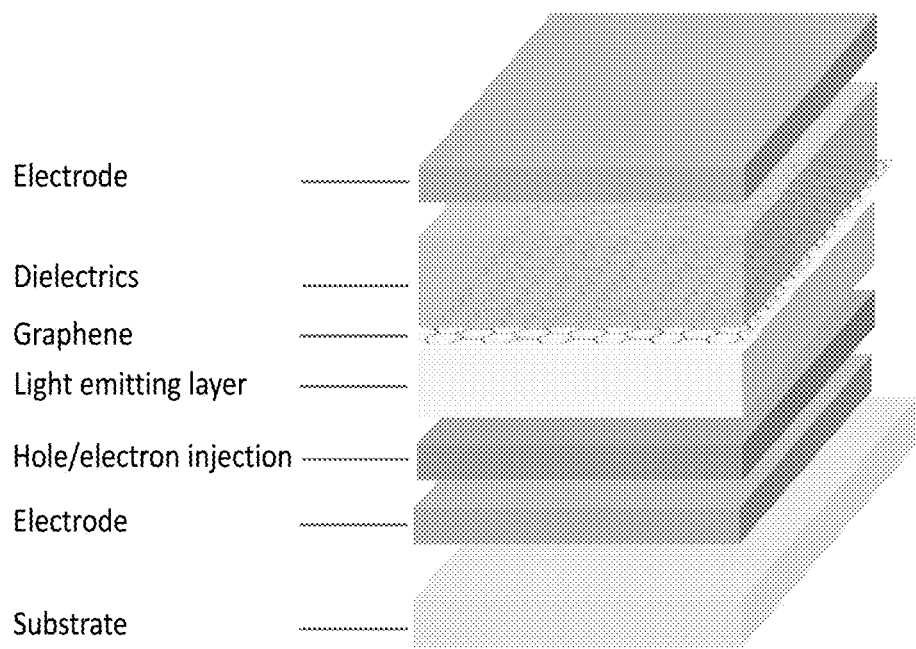
FIG. 1B provides a schematic diagram of a top-gated organic light emitting diode with a graphene injection electrode in accordance with embodiments of the invention.

In many embodiments, schematics of which are provided in FIGS. 1A and 1B, the instant disclosure provides VOLET and OLED devices having a carbon (e.g., graphene) injection electrode. As shown, in some such embodiments the structure of such carbon enabled VOLETs and OLEDs comprise, a heterostructure disposed between suitable electrodes (e.g., metal such as Al, Mo, Cr, Cu, Ag, Pt, Pd, Au, etc.) comprising a graphene injection electrode (e.g., formed of layer of graphene transferred, printed or grown) disposed atop a suitable dielectric (e.g., $Al_2O_3$, $SiO_2$, $HfO_2$, SiNx, $ZrO_2$, $BaSrO_3$, $BaTiO_3$, polymer, polymer electrolytes, electrolytes, ionic liquids, ionic gels, etc.) and between the dielectric and a light emitting layer (e.g., suitable RGB small molecules or conjugated polymers), and a hole/electron injection layer (e.g., suitable semiconductor in many embodiments an organic semiconductor material) disposed opposite the graphene injection electrode and adjacent the light emitting layer. Although FIG. 1A provides a schematic diagram showing a bottom-gated OLED where the graphene injection electrode is disposed below the OLED (e.g., the light emitting and hole/electron injection layers), in accordance with embodiments if the gated graphene injection electrode is instead disposed atop the OLED it is possible to obtain a top-gated OLED, as shown, for example, in FIG. 1B.

Figure 2:
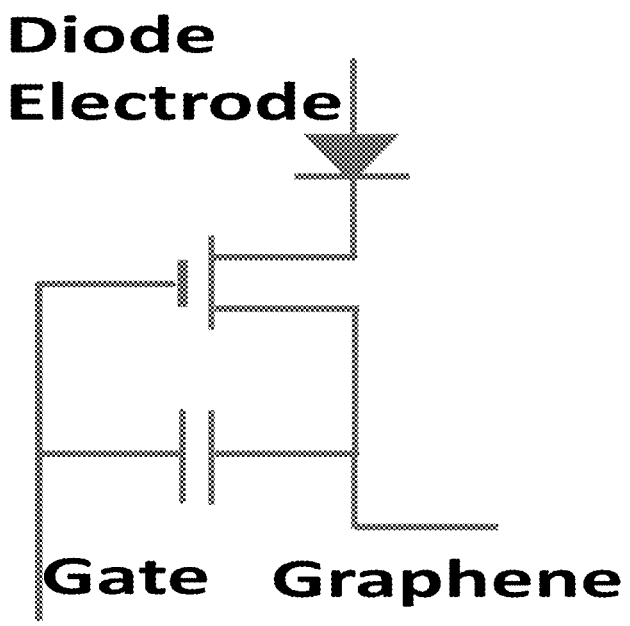
FIG. 2 provides a schematic circuit diagram of a gated organic light emitting diode in accordance with embodiments of the invention.

To understand the principle of the construction of the graphene enabled OLED devices in accordance with embodiments, FIG. 2 provides a circuit diagram. As shown, OLEDs in accordance with embodiments comprise at their core a Shottky Barrier transistor formed by the contact of the graphene injection electrode and the light-emitting material. In turn, the dielectrics sandwiched between the gate electrode and the graphene forms a capacitor, and the heterostructure comprising the graphene injection electrode, light-emitting material, hole/electron injection layer and diode electrode form the OLET itself. Importantly, the presence of the graphene injection electrode of the device, and the inherent physical properties of the graphene material that allows for the modulation of graphene's work function (e.g., carrier concentration) under the influence of an external electric field also allows for the Schottky Barrier transistor to be tuned (e.g., potential barrier height adjusted), in turn allowing for the OLET itself to be tuned as desired during operation.

Embodiments of VOLETs and OLEDs Comprising Multiple Graphene Electrodes

As discussed above, VOLETs and OLEDs generally comprise a capacitor and light emitting cells joined by a common electrode. Accordingly, in many embodiments vertical light emitting transistors and gated organic light emitting diodes are provided that include a light emitting cell that includes a light emitting layer formed of at least one light emitting material, a least one capacitor that includes a dielectric layer formed of at least one dielectric material, wherein at least the electrode disposed between the light emitting layer and the dielectric layer is a graphene electron injection electrode, such that the properties of the devices (e.g., brightness and efficiency) can be controlled by tailoring the work function of the graphene via an electrostatic gating field. However, as also described, three electrodes are required in an OLED, a common-source electrode, a gate electrode, and a drain electrode. In many embodiments all of these electrodes may be formed by graphene layers.

Figure 3A:
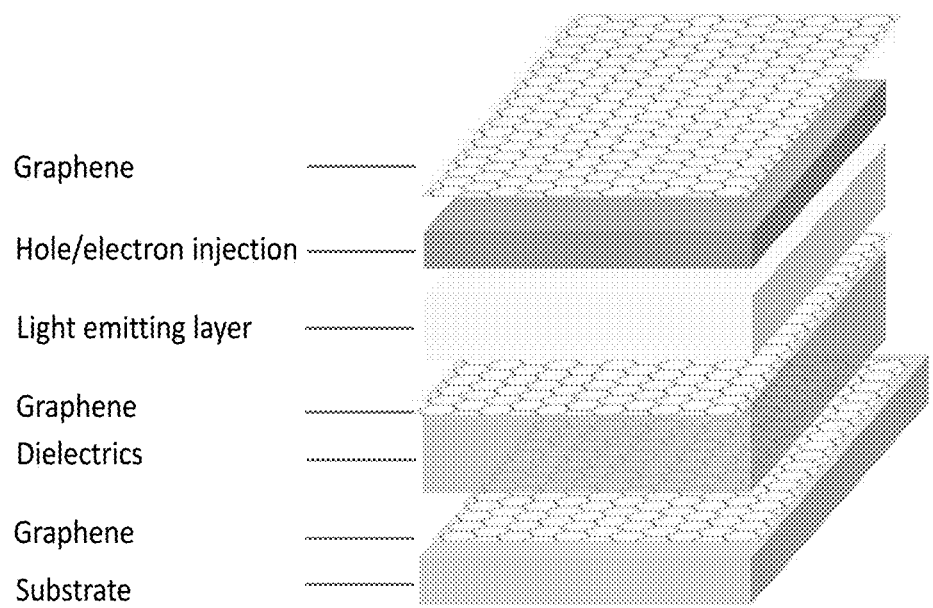
FIG. 3A provides a schematic diagram of a bottom-gated organic light emitting diode with graphene electrodes in accordance with embodiments of the invention.
Figure 3B:
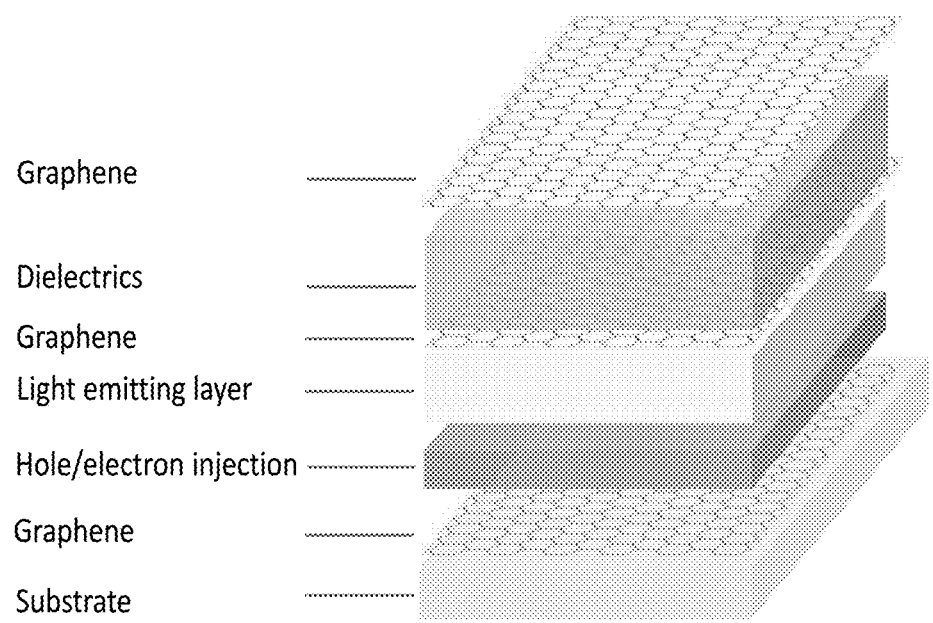
FIG. 3B provides a schematic diagram of a top-gated organic light emitting diode with graphene electrodes in accordance with embodiments of the invention.

Specifically, as shown in FIGS. 3A and 3B, many embodiments are directed to OLEDs in which the conventional metal electrodes are replaced by transparent graphene electrodes. In these cases, the gated OLEDs would be fully transparent. Alternatively, the gate and drain electrodes could be formed of other suitable transparent electrode materials, such as, for example transparent conductive oxides, such as, ITO or IZO, which may also enable transparent devices. Regardless of the specific transparent electrode materials used, as shown in figures, both bottom-gated (FIG. 3A) and top-gated (FIG. 3B) OLEDs with all transparent (e.g., graphene) electrodes may be formed in accordance with embodiments.

Embodiments of VOLETs and OLEDs Comprising Heterojunctions

Although single transistor VOLET and OLED device structures have been described, it should be understood that the materials and layers discussed above may be combined in a variety of different configurations. For example, as shown in FIGS. 3A and 3B a singly gated VLET in accordance with embodiments may generally include at least drain, source and gate electrodes, which may be formed using graphene electrodes surrounding a light emitting layer (such as formed by an organic light emitting material), and a dielectric layer (such as an ionic gel) sandwiched between the light emitting layer and a further gate electrode (which could again be formed of graphene). In other embodiments, for example, a vertical heterojunction transistor may also be formed.

Figure 4A:
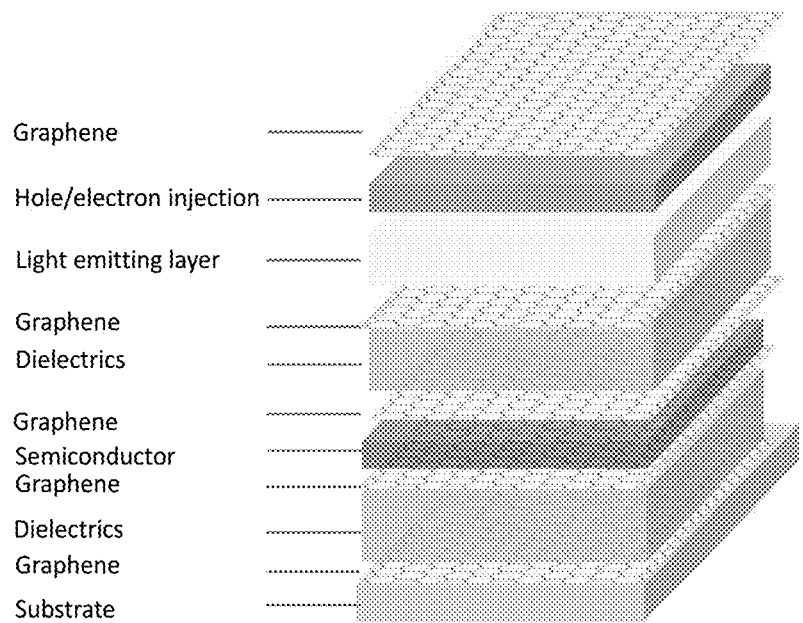
FIG. 4A provides a schematic diagram of a bottom-controlled organic light emitting diode with graphene electrodes in accordance with embodiments of the invention.
Figure 4B:
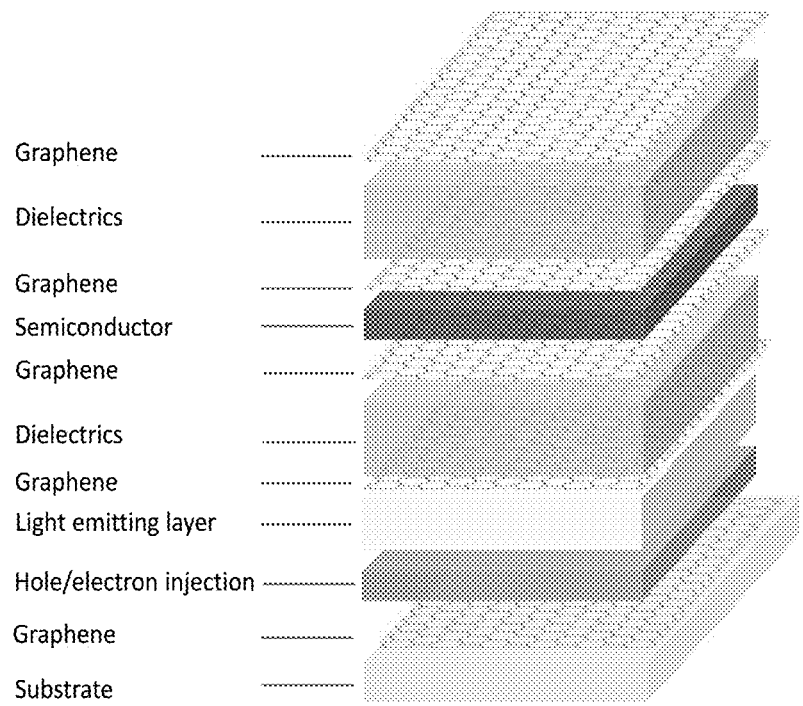
FIG. 4B provides a schematic diagram of a top-controlled organic light emitting diode with graphene electrodes in accordance with embodiments of the invention.

Specifically, in the exemplary embodiments provided in FIGS. 4A and 4B a graphene enabled vertical heterojunction transistor may be implemented. As shown, in some embodiments, the graphene enabled vertical heterojunction transistor may comprise a switching transistor formed by a heterostructure comprising a semiconductor layer, a graphene electrode and a dielectric, the heterostructure being disposed between a switching transistor electrode and the diode electrode of the OLED. In the bottom-controlled heterojunction transistor of FIG. 4A the sequence of structures would be: a graphene electrode, a dielectrics layer, a second graphene electrode and a semiconductor stacked in sequence from bottom to top. Similarly, in embodiments of a top-gated OLED with all graphene electrodes (FIG. 3B), a graphene enabled vertical heterojunction transistor would be added as shown in FIG. 4B, where the graphene enabled vertical heterojunction transistor would be built with a graphene electrode, dielectrics layer, a graphene electrode and semiconductor stacked in sequence from top to bottom.

Figure 5:
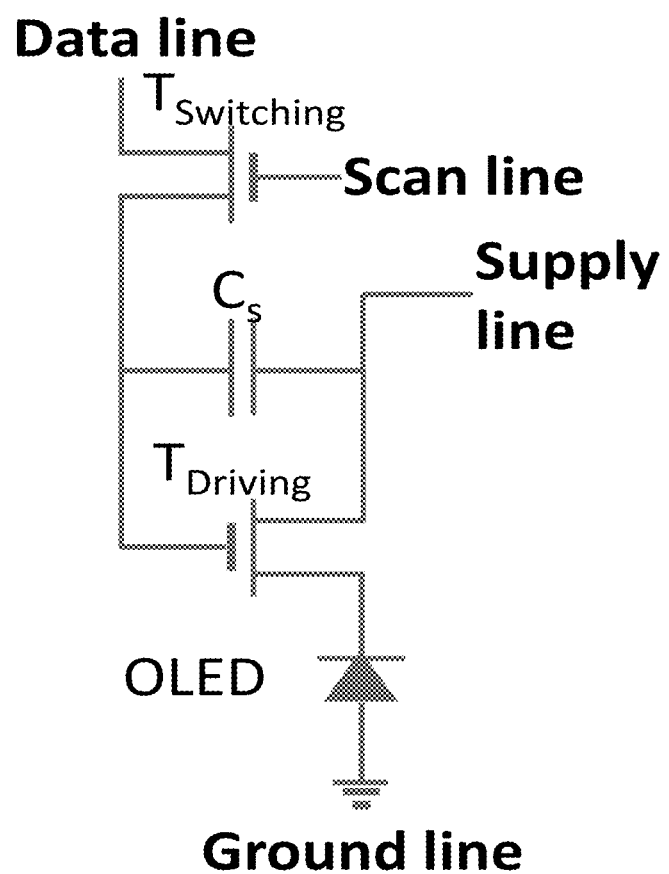
FIG. 5 provides a schematic circuit diagram of an organic light emitting diode with all graphene electrodes in accordance with embodiments of the invention.

Regardless of the specific alignment and exemplary circuit diagram of such a heterojunction transistor is presented in FIG. 5. As shown, in either embodiment the OLED is controlled by two transistors and one capacitor (e.g., 2T1C) circuitry.

Regardless of the specific architecture, it will be understood that the semiconductor can be inorganic semiconductors (n- and p-type silicon), oxide semiconductors (n-type indium gallium zinc oxide), flakes of 2D layered materials (hexagonal boron nitride, molybdenum disulfide, and tungsten disulfide), and organic thin films (P3HT and C60), as will be described in greater detail below. Similarly, although these embodiments are shown with all graphene electrodes, it will be understood that they may also be combined with embodiments incorporating conventional metal electrodes.

OLEDs formed in accordance with embodiments and controlled by such 21TC circuitry can be implemented as a single pixel unit of an OLED display. For example, where the OLED incorporates all transparent graphene electrodes, as shown in the exemplary embodiments provided in FIGS. 4A and 4B, such 21TC controlled OLEDs may be used in flexible and transparent OLED displays. With micrometer of sub-micrometers masks these stacked 21TC controlled OLEDs may also be fabricated into transparent OLED microdisplays with high resolution.

Embodiments of Alternative VOLET and OLED Architectures

In addition, although the above has described conventional singly gated architectures VOLETs using novel combinations of materials in accordance with some embodiments, other embodiments are directed to novel architectures allowing for doubly gated VOLETs. Doubly gated VLETS in accordance with embodiments would include two gate electrodes and two layers of dielectric material (such as ionic gels) sandwiching the drain and source electrodes and in turn the light emitting layer (such as an OLED). An exemplary construction of such a doubly gated VOLET might include, for example, a graphene electrode on a flexible substrates (such as, e.g., PET) to form graphene gate electrodes, then a dielectric layer (such as an ionic gel, LiF) atop of a graphene drain electrode, graphene electrodes again atop of a dielectric layer, and a graphenel-dielectric layerigraphene electrode with a graphene electrodeldielectrics layerigraphene supported polymer emitter to form doubly-gated graphene enabled VOLETs on graphene conductive porous electrodes. In short, in a singly gated VOLET there is a single gated transistor interconnected with the gate electrode along the data line. The source electrode is in turn connected to the $V_{DD}$, and the drain electrode is connected to the light emitting layer. The TFT turns on when a voltage pulse is applied to the gate electrode. As a result, the signal voltage can be transmitted to the drain, and subsequently, the light emitting layer, which is connected as load to the TFT. In a doubly-gated architecture, a second gate electrode and "gate line" is introduced into the circuits. In such embodiments, the light emitting layer is interconnected to the drain electrode through this second gate electrode. This doubly gated VOLET architecture allows for the adjustment of the charge carrier from the top and bottom electrodes, and for the control of the transportation, injection and recombination of charge carriers to reach charge carrier balance for maximum efficiency and brightness. Moreover, whereas in a singly gated VOLET an additional transistor is required to perform switching and scribing, in a doubly gated VLET a single device can serve both functions simultaneously.

More detailed descriptions of these exemplary structures, their construction and performance are provided in U.S. Pat. No. 9,445,421, the disclosure of which is incorporated herein by reference. However, although examples of specific structures and combinations of materials and layers have been discussed, it should be understood that the various components described herein may be combined and arranged in a variety of device architectures contemplated within the disclosed embodiments. For example, although the above exemplary embodiments and discussion has focused on methods, architectures and structures for individual devices, it will be understood that the same architectures and structures may be combined as pixels into a VOLET display device. In such an embodiment, a plurality of VOLETs as described herein may be combined and interconnected as is well-known by those skilled in the art, such as by electronically coupling the VOLETs into addressing electrode lines, to form a TFT-backplane for a display, such as an AMOLED display having very high resolution >2000 dpi.

Embodiments of Materials for VOLETs and OLEDs

It should be understood that the materials and methods used to form the required components of the VOLET and OLED devices described herein may take any form suitable for a desired application. For example, for the purposes of this disclosure the term "graphene" may mean any suitable form of gate tunable carbon capable of being formed into suitable device layers. The following discussion will focus specifically on forms of graphene, although other forms of carbon capable of work function modulation may also be used.

In many embodiments, the graphene material layer can comprise one or more graphene sheets, one or more graphene oxide sheets, one or more fluorographene sheets, one or more graphane sheet, one or more functionalized graphene sheets, or combinations thereof. For example, in some embodiments a graphene material layer may be a material that has graphene oxide sheet or a fluorographene sheet on the first surface of the graphene material layer, a graphene sheet on the second surface of the graphene material layer, and one or more graphene sheets intermediate between graphene oxide sheet or fluorographene sheet on the first surface and the graphene sheet on the second surface. Other embodiments for the graphene material layer can have other arrangements for the stacking of graphene sheets, graphene oxide sheets, fluorographene sheets, or the functionalized graphene sheets. Each sheet of the graphene material layer can be selected for N-type or P-type doping characteristics, carrier density characteristics, zero-bandgap or non-zero bandgap characteristics, and mobility characteristics. The graphene material layer can have intercalated atoms or molecules between the graphene sheets such as intercalated hydrogen, intercalated oxygen, intercalated gold, intercalated boron, intercalated bromine, intercalated nitrogen, or other atoms or molecules. The intercalated atoms or molecules can change the doping characteristics and bandgap of each of the graphene sheets and can induce a non-zero bandgap in the graphene sheets.

The graphene material layer can be formed on a desired surface (e.g., substrate, dielectric, semiconductor, etc.) by epitaxial growth of a graphene material layer on the substrate (such as a SiC substrate, catalytic or transition metal film on a substrate, or catalytic or transition metal foil substrate), by growth of a graphene material layer on a second substrate and then transfer and bonding of the graphene material layer to the substrate, by deposition of a graphene material layer, by growth of a graphene material layer at the interface between a metal layer and a substrate surface, or by transfer of a graphene sheet printed or formed elsewhere.

The graphene material layer can have small bandgap (in the case of bi-layer graphene or doped graphene) or no bandgap (in the case of single-layer graphene). Alternatively, the graphene material layers, may comprise one or more sheets of graphene that have N-type conduction properties (having predominantly electron conduction), one or more sheets that have P-type conduction properties (having predominantly hole conduction), or, in some embodiments, may comprise a layered structure having one or more sheets with N-type conduction properties and one or more sheets with P-type conduction properties, interlayered with one or more undoped sheets of graphene. In some cases, one or more of the top and the bottom graphene layers may be doped in a different way than the remaining graphene layers in the graphene material layer.

Graphene material layers may be formed with certain desirable properties including:

A low sheet resistance that increases the maximum frequency of operation may also be formed. A low graphene material layer sheet resistance can enable light-emitting devices and lasers with low forward voltage. A low graphene material layer sheet resistance is also important to achieve an electronic device with high maximum frequency of operation.

High resistance to atoms diffusing vertically (perpendicular to the graphene sheet) through the graphene sheet to prevent impurities that are in the substrate material (such as impurities in a metal foil) from diffusing through the graphene sheet into a semiconductor material film.

Similarly, in any of the above embodiments suitable supportive substrate layers may be formed of either traditional rigid materials such as silicon wafer, glass, ITO, or flexible materials such as PET, Kapton, polyimides so long as the substrates allow for the deposition/growth of the necessary functional layers of the devices (dielectric, LEP, graphene electrodes, etc.). The substrate can also contain one or more material layers of metal, metal foil, silicon, germanium, GaN, AlN, AlGaN ZnO, BN, SiC, GaN, InP, InAs, silicon, germanium, GaSb, GaP, ZnS, InGaAs, InGaN, InAsP, InP, InGaAs, InAlAs, InGaSb, diamond, polycrystalline diamond, Chemical Vapor Deposited Diamond, composite of polycrystalline diamond and CVD diamond, low surface roughness polycrystalline diamond, or other diamond substrate material GaAs, SiC, GaSb, AlP, ZnS, GaP, AlSb, AlAs, InGaN, AlN, CdSe, InAs, SnO2:F, InSb, ZnO, BN, CdTe, CdS, In2O3:Sn, InGaN, InAsP, InP, InGaAs, InAlAs, InGaSb, metal layer on diamond, glass, metal layer on glass, quartz, metal layer on quartz, ceramic, metal layer on ceramic, polycrystalline, metal layer on polycrystalline, single crystalline, amorphous, metal layer on amorphous, Bragg mirror layers on a substrate, etch stop layer on a substrate, or composites of such material layers.

Likewise, any suitable light emitting small molecule or polymer may be used in association with embodiments of the VOLET devices described herein. Some examples of suitable LEPs include, poly(1,4-phenylene vinylene) (PPV), Poly(2-methoxy-5-(2-ethylhexyloxy)-1,4-phenylenevinylene) (MEH-PPV), poly(1,4-phenylene) (PPP), polyfluorenes (PFO), nitrogen containing polymers, such as, for example, poly(2,5-pyridine vinylene) or poly(9-vinylcarbazole) (PVK), poly(thiophenes), and water-soluble LEPs such as sulfonated PPV, PPP and PF; and light emitting small molecules including organometallic Iridium complexes, small conjugated organic molecules such as porphyrin and pentacene for example. It should also be understood that embodiments of VOLETs do not have to use small organic molecules or LEPs, and can be formed with other types of light emitting materials, including semiconductor nanowires such as may be formed of Si or GaAs, quantum walls such as GaN, and conventional semiconductor materials across the entire wavelength spectrum, such as, for example, infrared emitters (GaAs), red emitters (AlGaAs & GaP), orange emitters (GaAsP & GaP), yellow emitters (AlGaInP & GaP), green emitters (GaN & GaP), blue emitters (ZnSe), violet emitters (InGaN), ultraviolet emitters (AlN), etc. And, these materials may be formed and/or embedded within elastomeric materials such that they are flexible allowing for the formation of flexible VOLETs and thus displays.

A variety of dielectric materials may also be used in embodiments, such as for example, ionic gels formed of dielectric polymers and ionic liquids, such as, for example, polystyrene-co-poly(methyl methacrylate)-co-polystyrene (PS-PMMA-PS)/1-ethyl-3-methylimidazolium (trifluoromethylsulfonyl)imide (EMIM TFSI), $BaTiO_3$/PMMA‖PEDOT/PSS, n-octadecylphosphonic acid SAM‖PEDOT/PSS, and CYTOP, and other printable or thermal vapor deposited dielectric materials such as dielectric polymers including PMMA, Teflon, CYTOP, Nafion and the like; oxides including, $SiO_2$, $Al_2O_3$, $ZrO_2$, $HfO_2$, $TiO_2$, and the like; inorganic salts including, LiF, CsF, $SrTiO_3$, $BaTiO_3$ and the like; and nitrides including $Si_3N_4$, etc.

A variety of additional layers might also be included in embodiments of the devices. For example, electron injection and transportation layers incorporating dipole molecules for PLEDs may also be included. Such thin layers of such dipole molecules function by correcting the orientation of the dipole leading to an increase in the effective work function and the improvement of electron injection in PLED devices. In particular, it has been found that a spin-coated thin layer with 0.1% weight 1-(3-hexadecylimidazolyl)-tris(1-imidazolyl)borate ($C_{16}$-Blm$_4$) in methanol solution improved the performance of PLEDs. (See, e.g., H. P. Li, et al., Journal of the American Chemical Society, vol. 131, pp. 8903-8912, 2009; and H. P. Li, et al., U.S. patent application Ser. No. 12/592,761, 2009, the disclosures of which are incorporated herein by reference.)

Likewise, in some embodiments conjugated polyelectrolytes (CPE) may be used to improve the efficiency of PLEDs, polymer solar cells, and thin-film transistors. These improvements have been ascribed to the enhanced electron injection ability of CPE. (See, e.g., R. Yang, et al., Journal of the American Chemical Society, vol. 128, pp. 14422-14423, 2006; J. H. Seo, et al., Journal of the American Chemical Society, vol, 133, pp. 8416-8419, 2011; and J. H. Seo, et al., Journal of the American Chemical Society, vol. 131, pp. 18220-18221, 2009, the disclosures of each of which are incorporated herein by reference.) Recently, it was demonstrated that by introducing a CPE layer between gold electrodes (Drain/Source) and light emitting polymers, the performance of PLETs were remarkably improved, again as a result of enhanced electron injection again. (See, e.g., J. H. Seo, et al., Advanced Functional Materials, vol. 21, pp. 3667-3672, 2011, the disclosure of which is incorporated herein by reference.) Alternatively or in addition, organic species, such as propionylethyleneimine-co-ethyleneimine (PEI-EI) may be introduced to improve the electron injection of the LEPs.

Finally, for hole injection layers, polyanilines, PEDOTs and polythiophene derivatives, as well as small molecules like cyano carbons such as, for example tetrafluoro-tetracyanoquinodimethane (F4-TCNQ), TCNQ, trichloroethylene (TCE), and others may be used. With gate modulation, the induced increase of charge carriers (including electron or hole) can improve both charge injection and charge transportation.

In addition, although the above has assumed that the conductive electrodes would be formed of carbon materials, such as, for example, graphene materials, it should be understood that the devices may also have other electrode types. For example, in some embodiments, one or more conductive source and drain electrodes may be incorporated with gate electrodes formed from materials such as, for example, carbon nanotubes, ITO, Au, Al, Cu, Ni, Mo, Cr, Ag, metal nanowires, metal meshes, metal grids, holey copper and holey graphene, and conductive polymers such as, poly(3,4-ethylenedioxythiophene)/poly(styrenesulfonate) (PEDOT/PSS).\

Finally, in heterojunction embodiments, the semiconductor material layer may comprise one or more of AlGaN, GaN, AlIN, InGaN, InN, AlN, silicon, germanium, SiGe, silicene, germanene, ZrB2, GaAs, InGaAs, InAs, ZnO, BN, InAsP, InP, InAlAs, InAs InGaSb, SiC, GaSb AlP, ZnS, ZrB2, GaP, AlSb, InSb, AlAs, InAsP, InP, CdSe, SnO2:F, ZnO, BN, In2O3:Sn, diamond, CdTe, CdS, ZnTe, copper indium gallium selenide, copper zinc tin sulfide, copper zinc tin selenide, ZnS, and copper oxide. The semiconductor material layer can also be an artificially structured material, a non-single crystalline material, an organic semiconductor material, a polymer semiconductor material, a liquid crystalline polymer material, a crystalline polymer material, and a quasi-crystalline polymer material. Examples of organic semiconductor material include PEDOT, PEDOT:PSS and Spiro-OMeTAD. The semiconductor material film can comprise one or more semiconductor layers. The growth temperature for semiconductor material film by either CVD, MOCVD, Plasma MOCVD, remote plasma MOCVD, ALE, MBE, plasma deposition, pulse laser deposition, solid phase epitaxy, liquid phase epitaxy, spin coating, and spray coating.

Methods for Manufacturing VOLET and OLED Devices

Some embodiments are directed to methods of fabricating graphene enables VOLETs and LEDs generally. Generally, any suitable method of deposition may be used with the various layers and structures of the current invention including, for example, additive manufacturing, molecular beam epitaxy (MBE) chemical vapor deposition (CVD), atomic layer deposition (ALD), and plasma enhanced using low cost printing, spin-coating, spray coating methods, in many embodiments, printing, such as aerosol jet printing, may be used to deposit one or more of the layers of the LET and LED devices, including LEP inks as active light emitting materials and carbon to form carbon electrodes of VOLETs on substrates.

Turning first to the formation of the graphene layers, the primary approaches for forming a graphene material layer on a substrate (e.g., substrate, dielectric or semiconductor, etc.) are by epitaxial growth, Chemical Vapor Deposition (CVD) (e.g., on a metal film on a substrate or by growth on a metal foil substrate), growth of a graphene material layer on a second substrate and then transfer and bonding of the graphene material layer to the substrate, deposition on a substrate by microwave plasma enhanced chemical vapor deposition, growth of graphene at the interface between a metal and a substrate as described by, or by other methods known to those skilled in the art. In some embodiments, the graphene material layer can be formed by epitaxial growth of graphene material on the surface of a SiC semiconductor with the SiC semiconductor also performing as a substrate. In other embodiments, the graphene material layer can be grown on the surface of a metal layer on a substrate or on a metal foil such as copper, nickel, iron, cobalt, and other metal foil material that is known to those skilled in the art. In still further other embodiments, the graphene material layer can be formed on a second substrate such copper, nickel, iron, cobalt, silicon carbide, and other substrates known to those skilled in the art and then be transferred and bonded to the surface of the substrate. In still further embodiments, the graphene material layer can formed on the surface of a substrate by deposition of a graphene material layer such as by microwave plasma enhanced chemical vapor deposition.

In other embodiments the graphene layers can be formed by printing methods, such as aerosol, roll to roll, screen and ink jet, for example, may be used to form graphene layers, nanoparticles, polymer emitters, ionic gels, and conjugated polyelectrolytes that can be used to improve OLET performance, and to produce graphene electrode supported organic light emitting devices.

Printing is one of the most promising techniques for inexpensive large area fabrication of plastic and nanomaterials electronics. In particular, aerosol-jet printing enables finer feature sizes than traditional ink-jetting and screen printing technologies. Aerosol jet printing utilizes an innovative direct-writing and aerodynamic focusing technology that produces electronics and physical structures with feature sizes down to 10 microns line width and 20 nm thickness. These systems can also print a wide variety of materials including conductive nanoparticle inks, screen printing pastes, polymers insulators, adhesives, etchants, and even biological matter onto various substrates like non-planar surfaces. As a result, the range of possible components that can be printed include transistors, integrated circuits, photovoltaics, LED's, displays and sensors. Also, direct aerosol-jet printing simplifies the printing process as the material is deposited as a pre-defined pattern. Another aspect of current printing is its low-cost, precise deposition, low environmental impact and large area fabrication due to the small number of process steps, small amount of materials and high through-put. (See, e.g., J.-U. Park, et al., Nature Materials, Vol. 6, pp. 782-789, 2007, the disclosure of which is incorporated herein by reference.) In embodiments of the current invention printing system capable of printing over complex conformal surfaces, in deep trenches, and in high dense vertical interconnects for high performance of multi-chip packages may be used. One exemplary process utilizes a jet aerosol system such as the 3-D Optomec Aerosol Jet™ printer.

One advantage of the described depositions methods is that the different electrical and electronic components can be printed on top of each other, saving space and increasing reliability and sometimes they are all transparent. Accordingly, in some embodiments, deposition techniques for non-planar surfaces, such as spin-coating or printing may be used to deposit the graphene electrodes as well as coat LEPs or ionic gels atop of the graphene electrodes to form integrated graphene enabled VOLETs, which can be defined as display products and components manufactured using deposition methods and electrically functional materials, such as printing with electrically conductive inks. In short, using a deposition technique in accordance with embodiments, it is possible, provided a suitable substrate is present, to deposit the supportive graphene electrodes and then directly deposit atop these electrodes the necessary LEP layers (for light emitting structures) or dielectric materials (for capacitor structures), and to repeat this deposition process as necessary to form singly or doubly gated devices as described above.

In certain specific embodiments, aerosol jet printing can be utilized, where the aerosol jet printing is carried out using the following parameters; ultrasonic atomization at a voltage that ranges from about 20 to about 48 V, or pneumatic atomization with about 600 cubic centimeters per minute atomizer flow to generate aerosol in a diameter of about 1 to 5 μm, a sheath gas flow of about 20 to 50 cubic centimeters per minute, a carrier gas flow of about 10 to 20 cubic centimeters per minute, a nozzle diameter of from about 50 to 350 μm, such as, for example, 60 μm, 100 μm, 150 μm, 200 μm, 250 μm, or 300 μm, and a fiducial management with overlay registration of from about 1 to 2 μm. In certain embodiments, the carrier gas may be inert, including ultra-pure nitrogen, argon or combinations thereof. Utilizing such a printing technique it is possible to manufacture single and doubly gated VOLETs that exhibit a maximum external efficiency >5%, brightness >10,000 Cd/m$^2$ and full aperture at low power and low voltage, with improved lifetime and stability.

Regardless of the technique chose, the number and properties each of the graphene sheets in the graphene material layer can be chosen to provide the selected graphene material layer properties such as low sheet resistance or the selected electron transmission probability through the graphene material layer. In some embodiments, the preferred number of graphene sheets in the graphene material film is one graphene sheet. The graphene material layer can have special mobility, bandgap, and light absorption properties for the case of one graphene sheet. The graphene material layer with one graphene sheet will typically have zero bandgap, will have the highest mobility, and can have special spin transport properties. Alternatively, the graphene material layer can contain graphene sheets that are N-type or contain graphene sheets that are P-type or contain both N-type and P-type graphene sheets. The graphene material layer can have an overall P-type or N-type characteristic depending on the mobility, carrier density, and number of P-type or N-type graphene sheets within the graphene material layer. The graphene material layer can have selected free carrier concentration and impurity doping to generate the selected free carrier concentration. There are multiple growth techniques of forming P-type graphene material layers. Graphene sheets that are grown on the carbon face of SiC are often P-type. Graphene sheets intercalatated with gold are P-type. Graphene sheet grown by CVD on a copper film are typically P-type. Graphene sheets grown on the carbon face of SiC are often P-type. Graphene grown on the silicon face of SiC are often N-type. N-type graphene can be formed by annealing in ammonia ambient or in nitrogen ambient.

Turning to the deposition of the dielectric layer, it should be understood that any suitable dielectric material and deposition process may be incorporated with methods. For example, in many embodiments the dielectric layer may be made of inorganic and organic materials, an oxide, a nitride, or a nitrogen oxide, such as, for example, HfOx, SiNx, SiOx, TaOx, AlOx, Y$_2$O$_3$, or Si(ON)x. Moreover, the dielectric layer may be in a single layer structure, a dual layer structure or a multi-layer structure. The thicknesses of such structures may be take any size suitable to provide the dielectric function. In addition, the dielectric layer may be formed by any suitable the filming process, including, for example, magnetron sputtering, thermal evaporation, CVD (remote plasma, photo catalytic, etc.), PECVD, spin coating, liquid phase growth, etc. Finally, if necessary a variety of feedstock gas molecules may be made in association with such dielectric materials, including SiHx, NHx, $N_2$, and hydrogen free radical and ions. Similar techniques and materials may be used for the other passivation layers, including those etch-stop. In these steps the deposit temperatures and thicknesses of the passivation materials may be chosen as required.

Regardless of whether the VOLET is top or bottom-gated, all VOLETs may also incorporate the deposition of drain/source electrodes. It should be understood that any suitable combination of deposition techniques and materials may be utilized. For example, the drain/source electrode layer may be made of any suitable metal such as Cu, Al, Ag, Mo, Cr, Nd, Ni, Mn, Ti, Ta or W, or the alloy of two or more of these metals. The drain/source electrode may be in a single layer structure or a multi-layer structure, and the multi-layer structure may be of, for example Cu\Mo, Ti\Cu\Ti, Mo\Al\Mo or etc. The thickness of the drain/source electrode layer may be similarly be of any suitable size, such as from 10 nm to more than 100 μm, and in some embodiments around 400 nm, as shown in the figures. Likewise, although the process for depositing the drain/source is listed as comprising the steps of sputtering and patterning, it should be understood that many suitable and standard industrial processes may be use to pattern and deposit gate electrodes atop the substrate. For example, sputtering (or physical vapor deposition) may include one or a combination of electronic, potential, etching and chemical sputtering, among others. Deposition techniques may alternatively include, for example, chemical (CVD), plasma-enhanced vapor deposition (PECVD), and/or thermal evaporation, etc.

Where semiconductor layers are desired, such as in heterojunction devices, the semiconductor material film can be formed by deposition of material layers or by direct bonding of semiconductor material film (and optional graphene interface transition layer material) onto the first surface of the graphene material layer. The deposition approaches can include epitaxial growth, vapor phase growth, chemical vapor deposition (CVD) growth, pulse laser deposition growth, plasma enhanced CVD growth, atomic layer epitaxy growth, atomic layer deposition growth, physical vapor deposition, sputter deposition, ion beam deposition, E-beam evaporation, spin coating, and other deposition techniques known to those skilled in the art. In some embodiments, the semiconductor material film may be formed by epitaxial growth of a single-crystal material, a highly ordered material, a polycrystalline material, a nanocrystalline material, nanowire material, a spontaneous nucleated material, spontaneously nucleated isolated grains of material, an organic material, a polymer material, a polymer crystalline material, a liquid crystalline polymer material, a quasi-crystalline polymer material, a glass, an amorphous material, an artificially structured material, a non-single crystalline material, a metal material, or combinations thereof on the graphene material layer surface. The semiconductor material film may also be formed by wafer bonding semiconductor material film to the underlying layer.

The semiconductor material film can also have organic semiconductor material layers such as PEDOT, PEDOT:PSS. The silicene can be grown on ZrB2 that is epitaxially grown on graphene material layer. The semiconductor material film can comprise one or more semiconductor layers, in some embodiments including a graphene interface transition layer. The growth temperature for semiconductor material film by either CVD, MOCVD, Plasma enhanced MOCVD, remote plasma MOCVD, ALE, MBE, plasma deposition, pulse laser deposition, solid phase epitaxy, or liquid phase epitaxy typically uses deposition temperature of 25 C (room temperature) to 1800 C.

The semiconductor material film can have varying dopant concentrations within each of the semiconductor material films and the dopant can be N-type, P-type or undoped. The semiconductor material layer in contact with the Ohmic electrode is often selected to have high N-type or P-type doping concentration to achieve low contact resistance. Any one of the semiconductor, semimetal, or dielectric material layers can be N-type doped, P-type, or undoped. One or more of the semiconductor material layers within the semiconductor material film can be an insulator layer. In the preferred embodiment, there is at least one semiconductor material layers. Any one of the substrate material layers near the semiconductor material layer/graphene material layer interface can be P-type doped, can contain a P-type delta doped layer, or can contain a graded P-type doped layer. The P-type doped layer, P-type delta doped layer, or graded P-type doped layer is one approach to implement a thermionic emission injection structure at the semiconductor material film/graphene material layer interface and to aid in allowing a negative voltage to be applied to the N-type semiconductor material film relative to the graphene material layer without a low resistance connection between the graphene material layer and substrate. A preferred operation mode is to be able to apply a reverse bias between the graphene material layer and substrate without excessive current flow because of a low series resistance between graphene material layer and substrate. The semiconductor material film can have varying dopant concentrations within each of the semiconductor material layers, often having a high dopant concentration region in contact with the metal electrode connection to the semiconductor material film to achieve low contact resistance.

A number of steps in such processes may also require the patterning and etching of materials. In such processes any suitable patterning and etching technique may be incorporated with embodiments. In particular, many of the steps incorporate a patterning process by which a passivation layer is deposited and a pattern is formed through the passivation layer. Specifically, in many embodiments the passivation layer may be coated with a layer of any suitable photoresist. In such embodiments the photoresist may be exposed and developed by a mask plate to respectively form a photoresist unreserved area and a photoresist reserved area. For example, the photoresist of the unreserved area may correspond in various embodiments to an area where the via hole of the passivation layer is arranged.

Where necessary, any suitable optical photolithographic technique may be used, including for example, immersion lithography, dual-tone resist and multiple patterning electron beam lithography, X-ray lithography, extreme ultraviolet lithography, ion projection lithography, extreme ultraviolet lithography, nanoimprint lithography, dip-pen nanolithography, chemical lithography, soft lithography and magneto lithography, among others. Regardless of the specific techniques and light source used, such lithographic techniques generally incorporate several steps. In many embodiments, the layer to be patterned is first coated with a photoresist, such as by spin coating. In such techniques, a viscous, liquid solution of photoresist is dispensed onto the wafer, and the wafer is spun rapidly to produce a uniformly thick layer. The spin coating typically runs at 1200 to 4800 rpm for 30 to 60 seconds, and produces a layer between 0.5 and 2.5 micrometers thick. The spin coating process results in a uniform thin layer, usually with uniformity of within 5 to 10 nanometers, or more. In various embodiments, the photo resist-coated material may then be prebaked to drive off excess photoresist solvent, typically at 90 to 100° C. for 30 to 60 seconds on a hotplate. After the non-masked portions of the layer are etched, either by a liquid ("wet") or plasma ("dry") chemical agent to remove the uppermost layer of the substrate in the areas that are not protected by photoresist. After a photoresist is no longer needed, it is then removed from the substrate. This photoresist may be removed chemically or by a plasma or by heating.

Although specific deposition and patterning methods are disclosed, as well as specific materials for substrates, electrodes, dielectrics, passivation layers, etc., and specific conditions, including, thicknesses, temperatures etc., it will be understood that any of these parameters may be adjusted as necessary for the specific graphene enabled OLET or OLED configuration and operational parameters without fundamentally altering the principles of embodiments that incorporate the graphene layers disclosed herein.

EXEMPLARY EMBODIMENTS

Additional embodiments and features are set forth in part in the exemplary embodiment that follow, and in part will become apparent to those skilled in the art upon examination of the specification or may be learned by the practice of the invention. None of the specific embodiments are proposed to limit the scope of the remaining portions of the specification and the drawings, and they are provided as exemplary of the devices, methods and materials disclosed herein. In particular, although specific structures and particular combinations of materials are recited, it should be understood that these are merely provided as examples, and any suitable alternative architectures and materials may be substituted.

Example 1: Fabrication of Graphene Enabled OLED

In one exemplary embodiment, shown schematically in FIGS. 1A and 1B, on substrates like glass, plastics, and silicon wafers, a layer of metal electrode (Al, Mo, Cr, Cu, Ag, Pt, Pd and Au) may be fabricated, as described, following by the fabrication of dielectrics ($Al_2O_3$, $SiO_2$, $HfO_2$, $SiN_x$, $ZrO_2$, $BaSrO_3$, $BaTiO_3$, polymer, polymer electrolytes, electrolytes, ionic liquids, and ionic gels), again as previously discussed. Then a layer of graphene may be placed on dielectrics by transfer, printing, or directly growth, as described in greater detail above. On the top of graphene, light-emitting materials (RGB small molecules or conjugated polymers) are fabricated by evaporating or spin-coating, as discussed above. Atop of light-emitting materials, hole/electron injection layer may then be deposited by evaporating or spin-coating, as discussed. The final metal electrode may then deposited to complete the device as previously discussed. Utilizing such combination of methods and steps graphene, light-emitting material, hole/electron injection layer and diode electrode forming a light-emitting diode may be provided. Such devices may be bottom or top-gated, as shown in FIGS. 1A and 1B.

Example 2: Fabricating Heterojunction VOLET and OLEDs

In another exemplary embodiments, shown schematically in FIGS. 4A and 4B, under bottom-gated OLED with all graphene electrodes (FIG. 3A), a graphene enabled vertical heterojunction transistor is added (FIG. 4A). The graphene enabled vertical heterojunction transistor may be built with a graphene electrode, dielectrics layer, a graphene electrode and semiconductor stacked in sequence from bottom to top, where the OLED is bottom-controlled by two transistors and one capacitor (2T1C) circuitry. Similarly, on top-gated OLED with all graphene electrodes (FIG. 3B), a graphene enabled vertical heterojunction transistor is added (FIG. 4B), where the graphene enabled vertical heterojunction transistor was built with a graphene electrode, dielectrics layer, a graphene electrode and semiconductor stacked in sequence from top to bottom. Here, OLED is top-controlled by 2T1C circuitry.

Example 3: VOLET Displays

Finally, although the above exemplary embodiments and discussion has focused on methods, architectures and structures for individual devices, it will be understood that the same architectures and structures may be combined as pixels into a VOLET display device. In such an embodiment, a plurality of VOLETs as described herein may be combined and interconnected as is well-known by those skilled in the art, such as by electronically coupling the VOLETs into addressing electrode lines, to form a TFT-backplane for a display, such as an AMOLED display.

DOCTRINE OF EQUIVALENTS

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A carbon enabled vertical light emitting transistor, comprising:
   a light emitting cell comprised of a light emitting layer formed of at least one light emitting material, the light emitting layer having first and second sides in conductive relation to a conductive drain electrode and a source electrode;
   at least one capacitor comprised of a dielectric layer formed of at least one dielectric material, the at least one dielectric layer having first and second sides in conductive relation to one of either the conductive source or drain electrodes, and a conductive gate electrode;
   at least one substrate in supportive relation with each of said drain and gate electrodes; and
   a heterojunction transistor comprising an additional carbon electrode disposed between a dielectric layer and a semiconductor layer disposed adjacent the dielectric layer of the at least one capacitor such that the vertical light emitting transistor has a two transistor and one capacitor control;

wherein the drain and source electrodes are the cathode and anode of the light emitting cell; and wherein at least the electrode disposed between the light emitting layer and the dielectric layer is a gate tunable carbon electrode.

2. The vertical light emitting transistor of claim 1, wherein all of the electrodes are formed of a transparent carbon material.

3. The vertical light emitting transistor of claim 1, wherein the carbon electrode is formed of one or more layers selected from the group of graphene, graphene oxide, fluorographene, graphane, functionalized graphene sheets, or combinations thereof.

4. The vertical light emitting transistor of claim 1, wherein the light emitting layer is formed of a light emitting material selected from the group consisting of a crystalline semiconductor selected from GaN, GaP, GaAs, AlGaAs, GaAsP, AlGaInP, ZnSe, InGaN and AlN; a semiconductor nanowire selected from Si and GaAs; a quantum wall; an organometallic complex; an Ir organometallic complex; a small organic conjugated molecule; porphyrin; pentacene; and a conjugated polymer selected from PPV, PVK, MEH-PPV, PPF, PFO and PPP.

5. The vertical light emitting transistor of claim 1, wherein the dielectric material is selected from the group of an oxides selected from $SiO_2$, $Al_2O_3$, $HfO_2$, $ZrO_2$; a nitride; $Si_3N_4$; an inorganic salts selected from LiF, CsF, $BaTiO_3$, and $SrTiO_3$; a dielectric polymer selected from PMMA, Teflon, CYTOP, and Nafion; and an ionic gel formed from the combination of a dielectric polymer and an ionic liquid.

6. The vertical light emitting transistor of claim 1, further comprising at least one additional light emitting enhancement layer selected from the group consisting of electron injection dipole layers, transportation dipole layers, conjugate polyelectrolyte layers, and hole injection layers.

7. The vertical light emitting transistor of claim 1, wherein the substrate is selected from the group consisting of flexible plastics, Si wafer, glass, sapphire, and ITO.

8. The vertical light emitting transistor of claim 1, wherein the semiconductor layer is formed of a material selected from the group of inorganic semiconductors, oxide semiconductors, flakes of 2D layered materials, and organic thin films.

9. The vertical light emitting transistor of claim 1, wherein the vertical light emitting transistor is one of either top or bottom-gated.

10. A vertical light emitting display comprising a plurality of pixels comprising a plurality of vertical light emitting transistors electronically coupled into addressing electrode lines, each vertical light emitting transistor comprising:

a light emitting cell comprised of a light emitting layer formed of at least one light emitting material, the light emitting layer having first and second sides in conductive relation to a conductive drain electrode and a source electrode;

at least one capacitor comprised of a dielectric layer formed of at least one dielectric material, the at least one dielectric layer having first and second sides in conductive relation to one of either the conductive source or drain electrodes, and a conductive gate electrode; and at least one substrate in supportive relation with each of said drain and gate electrodes;

wherein the drain and source electrodes are the cathode and anode of the light emitting cell;

wherein at least the electrode disposed between the light emitting layer and the dielectric layer is a gate tunable carbon electrode; and wherein each of the vertical light emitting transistors further comprises a heterojunction comprising an additional carbon electrode disposed between a dielectric layer and a semiconductor layer disposed adjacent the dielectric layer of the at least one capacitor such that the vertical light emitting transistor has a two transistor and one capacitor control.

11. The vertical light emitting display of claim 10, wherein:

the light emitting layer is formed of a light emitting material selected from the group consisting of a crystalline semiconductor selected from GaN, GaP, GaAs, AlGaAs, GaAsP, AlGaInP, ZnSe, InGaN and AlN; a semiconductor nanowire selected from Si and GaAs; a quantum wall; an organometallic complex; an Ir organometallic complex; a small organic conjugated molecule; porphyrin; pentacene; and a conjugated polymer selected from PPV, PVK, MEH-PPV, PPF, PFO and PPP;

the dielectric material is selected from the group of an oxides selected from $SiO_2$, $Al_2O_3$, $HfO_2$, $ZrO_2$; a nitride; $Si_3N_4$; an inorganic salts selected from LiF, CsF, $BaTiO_3$, and $SrTiO_3$; a dielectric polymer selected from PMMA, Teflon, CYTOP, and Nafion; and an ionic gel formed from the combination of a dielectric polymer and an ionic liquid;

the substrate is selected from the group consisting of flexible plastics, Si wafer, glass, sapphire, and ITO; and wherein the at least one carbon electrode is formed from a material selected from the group of graphene, graphene oxide, fluorographene, graphane, functionalized graphene sheets, or combinations thereof.

* * * * *